US011847286B2

(12) United States Patent
Jeong et al.

(10) Patent No.: US 11,847,286 B2
(45) Date of Patent: Dec. 19, 2023

(54) DISPLAY DEVICE

(71) Applicant: SAMSUNG DISPLAY CO., LTD., Yongin-si (KR)

(72) Inventors: Hwan-Hee Jeong, Cheonan-si (KR); Youngbae Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/158,341

(22) Filed: Jan. 23, 2023

(65) Prior Publication Data

US 2023/0161446 A1 May 25, 2023

Related U.S. Application Data

(63) Continuation of application No. 17/366,940, filed on Jul. 2, 2021, now Pat. No. 11,579,736.

(30) Foreign Application Priority Data

Oct. 5, 2020 (KR) .................... 10-2020-0128088

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/0448* (2019.05); *H10K 50/841* (2023.02); *H10K 59/12* (2023.02); *H10K 59/40* (2023.02); *G06F 2203/04111* (2013.01); *G09G 3/20* (2013.01); *G09G 2310/0275* (2013.01)

(58) Field of Classification Search
CPC . G06F 2203/04112; G06F 2203/04103; G06F 2203/04111; G06F 3/0445; G06F 3/0412; G06F 3/0446; G06F 3/044; G06F 3/041; G06F 3/0448; G06F 3/047; G06F 3/0443; G06F 1/1643
See application file for complete search history.

(56) References Cited

U.S. PATENT DOCUMENTS 9,519,174 B2  12/2016  Kim et al.
2014/0320760 A1  10/2014  Ishizaki et al.
(Continued)

FOREIGN PATENT DOCUMENTS

KR   10-2009880   8/2019

*Primary Examiner* — Dong Hui Liang
(74) *Attorney, Agent, or Firm* — F. CHAU & ASSOCIATES, LLC

(57) ABSTRACT

A display device includes a display panel including unit pixel areas and an input sensor including first-line elements and second-line elements defining crossing areas with the first-line elements. First group elements among the first-line elements and the second-line elements are electrically connected to each other to define a first electrode. Second group elements among the first-line elements and the second-line elements are electrically connected to each other to define a second electrode, and the second electrode is insulated from the first electrode while crossing the first electrode. A first angle defined by a first direction and a second direction and a second angle defined in the crossing areas by the first-line elements and the second-line elements to correspond to the first angle are different from each other.

19 Claims, 23 Drawing Sheets

(51) Int. Cl.
  *H10K 59/12* (2023.01)
  *H10K 50/84* (2023.01)
  *H10K 59/40* (2023.01)
  *G09G 3/20* (2006.01)

(56) References Cited

U.S. PATENT DOCUMENTS

| | | |
|---|---|---|
| 2014/0347311 A1 | 11/2014 | Joharapurkar et al. |
| 2017/0010726 A1 | 1/2017 | Chen et al. |
| 2017/0102342 A1 | 4/2017 | Iwami |
| 2017/0185189 A1 | 6/2017 | Barton et al. |
| 2017/0200263 A1 | 7/2017 | Iwami |
| 2017/0228052 A1 | 8/2017 | Nakamura |
| 2019/0198574 A1 | 6/2019 | Jun et al. |
| 2022/0107708 A1 | 4/2022 | Jeong et al. |

< Mode 1 >

< Mode 2 >

< Mode 2 >

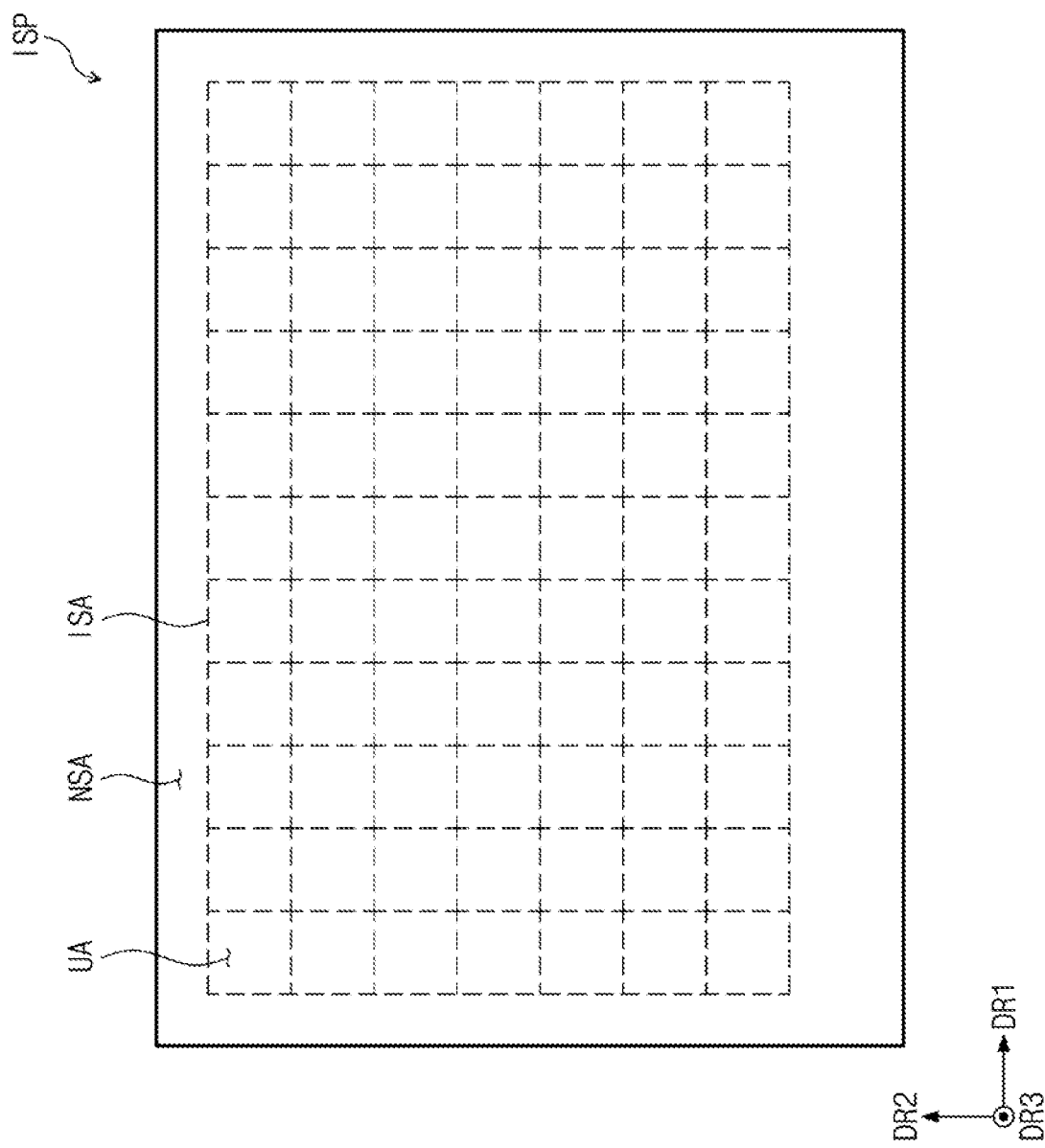

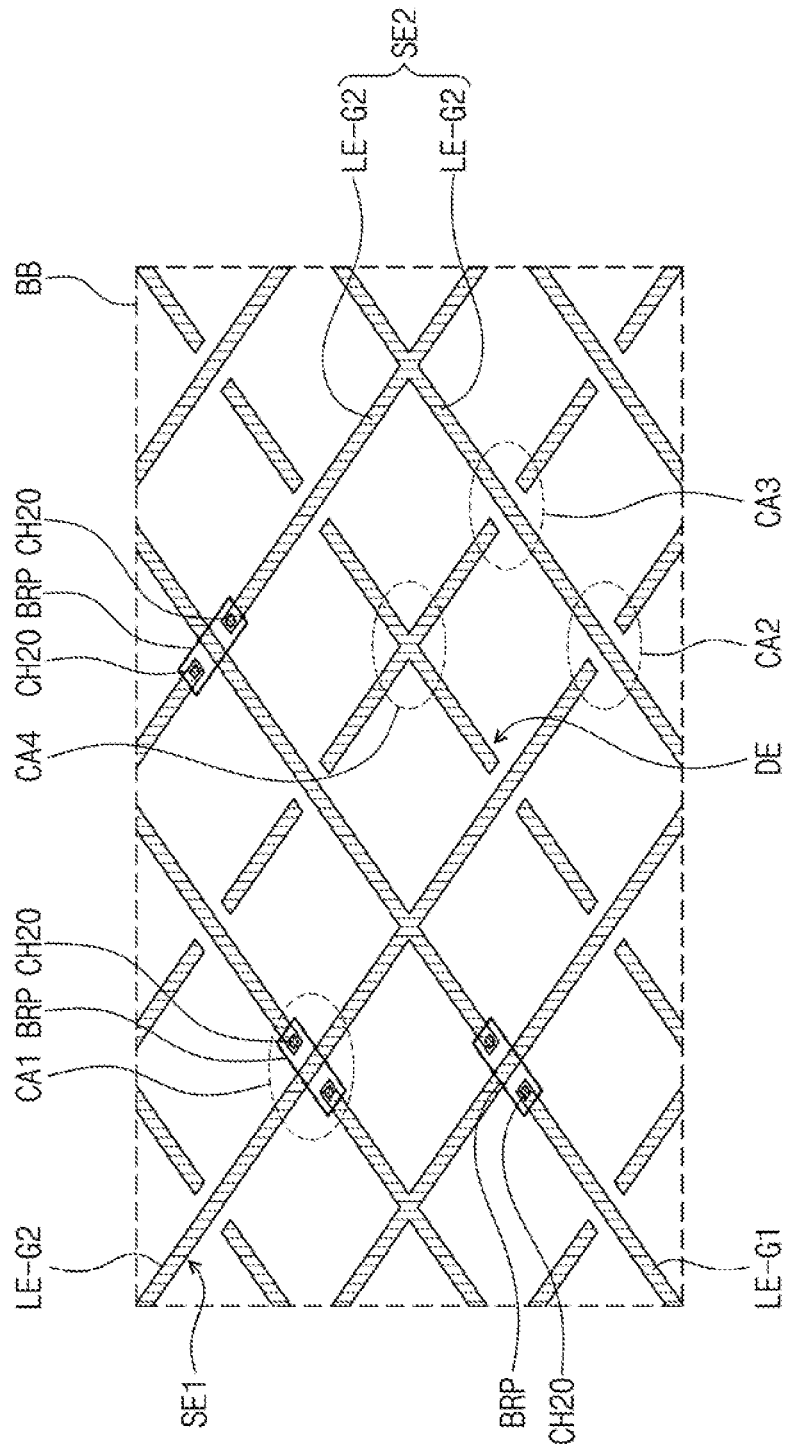

DISPLAY DEVICE

CROSS-REFERENCE TO RELATED APPLICATION

This U.S. non-provisional patent application is a Continuation of co-pending U.S. patent application Ser. No. 17/366,940, filed on Jul. 2, 2021, which claims priority under 35 U.S.C. § 119 to Korean Patent Application No. 10-2020-0128088, filed on Oct. 5, 2020, the contents of which are hereby incorporated by reference in their entirety.

TECHNICAL FIELD

The present disclosure relates to a display device. More particularly, the present disclosure relates to a display device having an input sensor with crossing line elements.

DISCUSSION OF THE RELATED ART

Multimedia electronic devices, such as televisions, mobile phones, tablet computers, navigation units, and portable game consoles, often include a display device that displays images. These display devices often include an input sensor that provides a touch-based input method allowing users to easily and intuitively input information or commands to the display device, in addition to the usual input methods, such as a button, a keyboard, a mouse, etc.

The input sensor may be configured to sense a touch or pressure generated by a user's body. Recently, active styluses are being used with such display devices as these styluses provide the user with a familiar way to input information that closely mimics the use of pen and paper and provides for precise input that is well suited for various applications such as drawing applications.

SUMMARY

A display device includes a display panel including unit pixel areas. Each unit pixel area has a quadrilateral shape including a first diagonal line and a second diagonal line crossing the first diagonal line. An input sensor is disposed on the display panel and includes a plurality of first-line elements and a plurality of second-line elements defining a plurality of crossing areas with the first-line elements. First group elements among the first-line elements and the second-line elements are electrically connected to each other to define a first electrode. Second group elements among the first-line elements and the second-line elements are electrically connected to each other to define a second electrode. The second electrode is insulated from the first electrode while crossing the first electrode. Third group elements among the first-line elements and the second-line elements define a dummy electrode insulated from the first electrode and the second electrode. A first angle defined by the first diagonal line and the second diagonal line and a second angle defined in the crossing areas by the first-line elements and the second-line elements to correspond to the first angle are different from each other.

A width of the first electrode in a first area in which the first electrode crosses the second electrode may be substantially the same as a width of the first electrode in a second area in which the first electrode does not cross the second electrode. A width of the second electrode in the first area may be substantially the same as a width of the second electrode in the second area.

The display panel may include a base layer, a transistor disposed on the base layer, a light emitting element electrically connected to the transistor, and an encapsulation substrate facing the base layer and encapsulating the light emitting element. The first-line elements and the second-line elements may be disposed on an upper surface of the encapsulation substrate, and an adhesive layer may be omitted from between the upper surface of the encapsulation substrate and the first-line elements and the second-line elements.

The crossing areas may include a first crossing area in which one of one element of the first-line elements and one element of the second-line elements is disconnected and the other of the one element of the first-line elements and the one element of the second-line elements passes through the disconnected portion and a second crossing area in which one element of the first-line elements is provided integrally with one element of the second-line elements.

The disconnected one element may be included in one of the first group elements and the second group elements, and the other element passing through the disconnected portion may be included in the other of the first group elements and the second group elements.

The display device may further include a bridge pattern. The first crossing area may be provided in plural, and the bridge pattern may be disposed in at least an area of the first crossing areas and may be disposed on a layer different from a layer on which the first-line elements and the second-line elements are disposed. The bridge pattern may connect the disconnected portion of the disconnected one element disposed in the at least area.

The bridge pattern may include a transparent conductive oxide.

The display device may further include a first signal line electrically connected to the first electrode. The first signal line may include a line portion and a pad portion disposed at an end of the line portion. The pad portion may include a first layer extending from the line portion and a second layer disposed on a layer different from the first layer and connected to the first layer. The second layer may include a same material as the bridge pattern.

The first-line elements and the second-line elements may include a metal material.

The disconnected one element may be included in the third group elements, and the other element passing through the disconnected portion may be included in the first group elements or the second group elements.

The one element of the first-line elements and the one element of the second-line elements, which are provided integrally with each other, may be included in the first group elements, the second group elements, or the third group elements.

The display device may further include an input device applying an input signal to the input sensor. The input sensor may sense a user input based on a variation in capacitance between the first electrode and the second electrode in a first mode and may sense an input by the input device based on the input signal in a second mode.

The first angle may be a right angle, and the second angle may be an acute angle or an obtuse angle.

Each of the unit pixel areas may include a plurality of emission areas, and the unit pixel areas may include a same number of the emission areas as each other.

A display device includes a display panel displaying an image and an input sensor disposed on the display panel. The input sensor includes a plurality of first electrodes disposed in a sensing area including a plurality of unit sensing areas arranged in a matrix form and a plurality of second electrodes crossing the first electrodes. The first electrodes and the second electrodes are defined by a plurality of line elements. The line elements include a plurality of first-line elements extending in a first direction and a plurality of second-line elements extending in a second direction crossing the first direction and defining a plurality of crossing areas with the first-line elements. Electrode-crossing areas of the first electrodes and the second electrodes are respectively disposed in the unit sensing areas. Each of the unit sensing areas includes a plurality of cell areas, each of the cell areas is defined by one crossing area disposed at a center of a corresponding cell area and four crossing areas closest to the one crossing area among the crossing areas, and corresponding cell areas among the cell areas are disposed in each of the unit sensing areas. The corresponding cell areas are arranged in an N by M matrix in each of the unit sensing areas, each of the N and the M is a multiple of 3, and the N and the M are each positive integers and are different from each other.

The first electrodes may extend in a third direction and may be arranged in a fourth direction crossing the third direction. Each of the unit sensing areas may have a first width in the third direction and a second width in the fourth direction. A third width in the fourth direction of each of the first electrodes may be substantially the same as the second width, and a fourth width in the third direction of each of the second electrodes may be substantially the same as the first width.

The first electrodes may extend in a third direction and may be arranged in a fourth direction crossing the third direction. Each of the unit sensing areas may have a first width in the third direction and a second width in the fourth direction, a third width in the fourth direction of each of the first electrodes may be smaller than the second width, and a fourth width in the third direction of each of the second electrodes may be smaller than the first width.

The first electrodes may extend in a third direction and may be arranged in a fourth direction crossing the third direction. Here, N may be greater than M, and a first width in the third direction of each of the cell areas may be greater than a second width in the fourth direction of each of the cell areas.

The display device may further include dummy electrodes insulated from the first electrodes and the second electrodes. The dummy electrodes may be defined by the line elements, and a crossing area defining a boundary of the first electrodes, the second electrodes, and the dummy electrodes among the crossing areas may allow one of a corresponding first-line element among the first-line elements and a corresponding second-line element among the second-line elements to be disconnected and the other of the corresponding first-line element among the first-line elements and the corresponding second-line element among the second-line elements to pass through the disconnected area.

A first group element among the first-line elements may define a first electrode line extending in the first direction of the first electrodes in the unit sensing areas, and a second group element among the first-line elements may define a second electrode line extending in the first direction of the second electrodes in the unit sensing areas.

The first electrode line may be provided in plural, and the second electrode line may be closer to one first electrode line among two first electrode lines most adjacent thereto in the second direction than the other first electrode line.

The first electrode line may be provided in plural, the second electrode line may be provided in plural, and a length of the longest first electrode line among the first electrode lines may be substantially the same as a length of the longest second electrode line among the second electrode lines.

The first electrode line may be provided in plural, the second electrode line may be provided in plural, and a length of the longest first electrode line among the first electrode lines may be smaller than a length of the longest second electrode line among the second electrode lines.

A first group element among the first-line elements may define first electrode lines extending in the first direction of the first electrodes in the unit sensing areas. A second group element among the first-line elements may defines second electrode lines extending in the first direction of the second electrodes in the unit sensing areas. A first group element among the second-line elements may define third electrode lines extending in the second direction of the first electrodes in the unit sensing areas. A second group element among the second-line elements may define fourth electrode lines extending in the second direction of the second electrodes in the unit sensing areas. A smallest polygonal shape defined by the first electrode lines and the third electrode lines may have a first area. The smallest polygonal shape defined by the second electrode lines and the third electrode lines may have a second area. The first area may be greater than the second area.

A display device includes a display panel having a plurality of pixels of a quadrilateral shape and a touch sensor layer disposed on the display panel. The touch sensor layer includes a plurality of first electrodes each having a diamond shape and a plurality of second electrodes each having a diamond shape. The plurality of second electrodes crosses the plurality of first electrodes while being insulated therefrom. A plurality of dummy electrodes is insulated from the plurality of first electrodes and the plurality of second electrodes.

The display panel may include an encapsulation substrate and the plurality of first electrodes or the plurality of second electrodes may be disposed directly on the encapsulation substrate without an adhesive layer disposed therebetween.

The electrodes of either the plurality of first electrodes or the plurality of second electrodes may have an open-diamond shape.

The electrodes of either the plurality of first electrodes or the plurality of second electrodes may have a closed-diamond shape.

BRIEF DESCRIPTION OF THE DRAWINGS

The above and other aspects of the present disclosure will become readily apparent by reference to the following detailed description when considered in conjunction with the accompanying drawings wherein:

FIG. 8A is a plan view illustrating an input sensor shown in FIG. 5;

FIG. 8J is an enlarged plan view illustrating a portion of FIG. 8C;

DETAILED DESCRIPTION

Figure 1A:
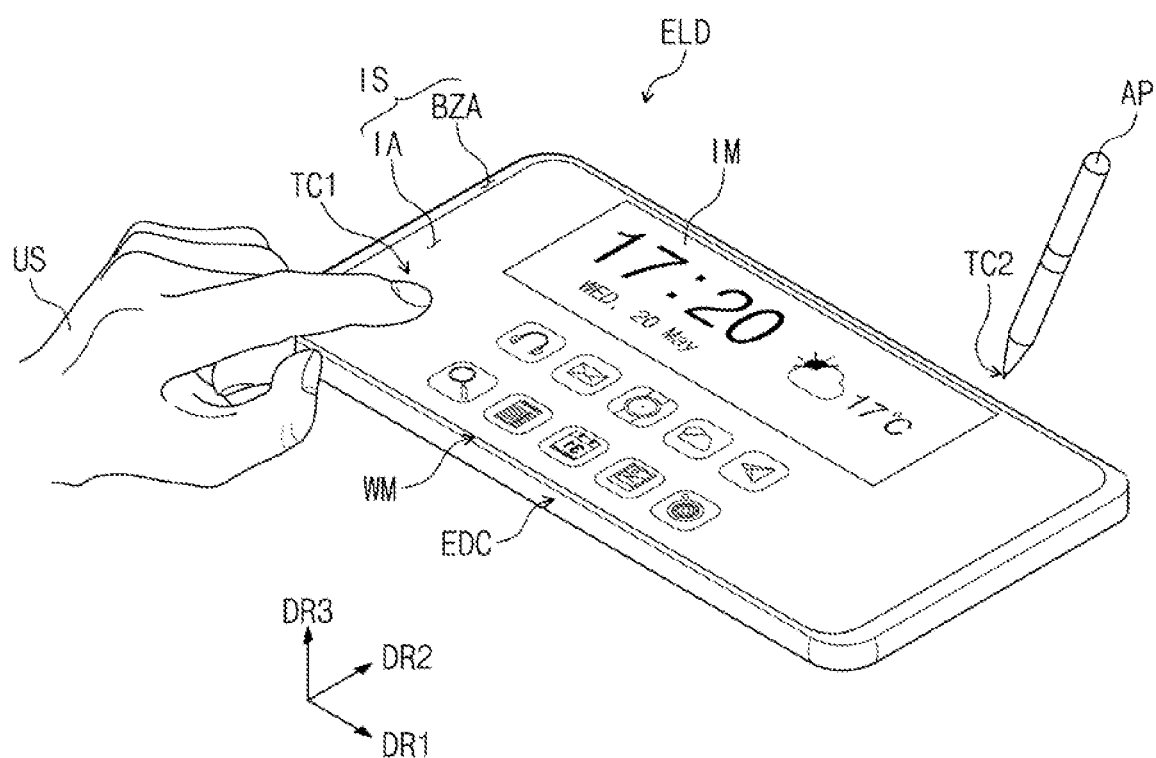
FIG. 1A is a perspective view illustrating an electronic device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not necessarily be limited by these terms. These terms may be used to distinguish one element, component, region, layer or section from another region, layer or section. Thus, a first element, component, region, layer or section discussed below could be termed a second element, component, region, layer or section without departing from the teachings of the present disclosure. As used herein, the singular forms "a", "an" and "the" are intended to include the plural forms as well, unless the context clearly indicates otherwise.

Spatially relative terms, such as "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure are described with reference to accompanying drawings.

Figure 1B:
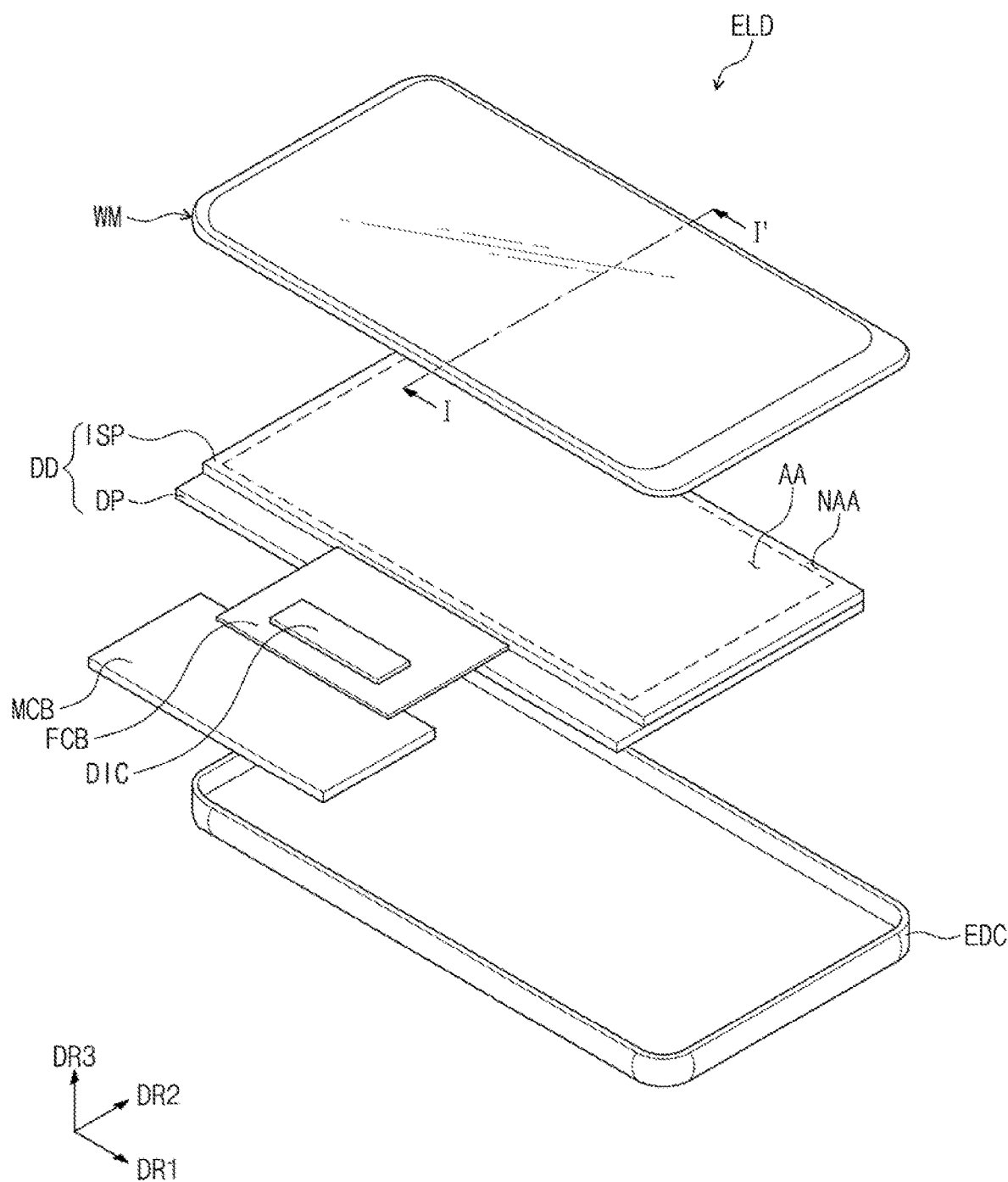
FIG. 1B is an exploded perspective view illustrating an electronic device according to an embodiment of the present disclosure.
Figure 2A:
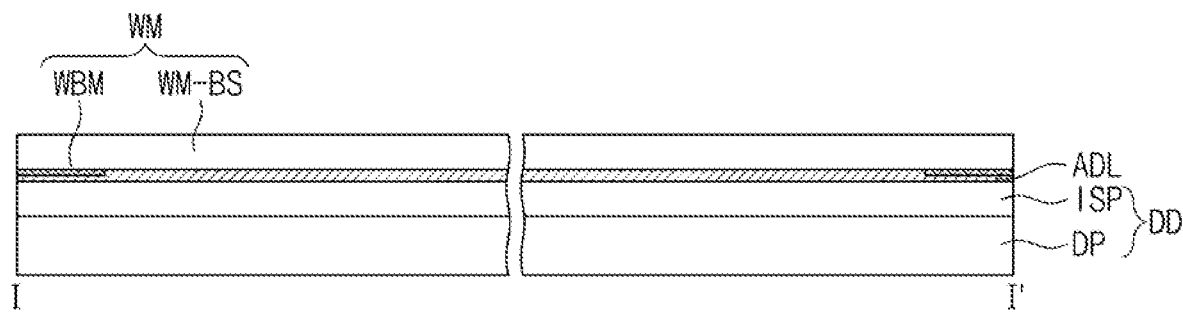
FIGS. 2A and 2B are cross-sectional views taken along a line I-I' of FIG. 1B illustrating an electronic device.
Figure 2B:
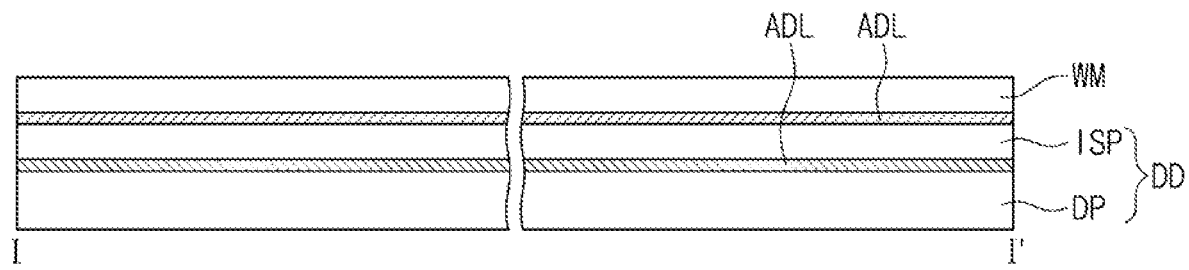
Figure 2C:
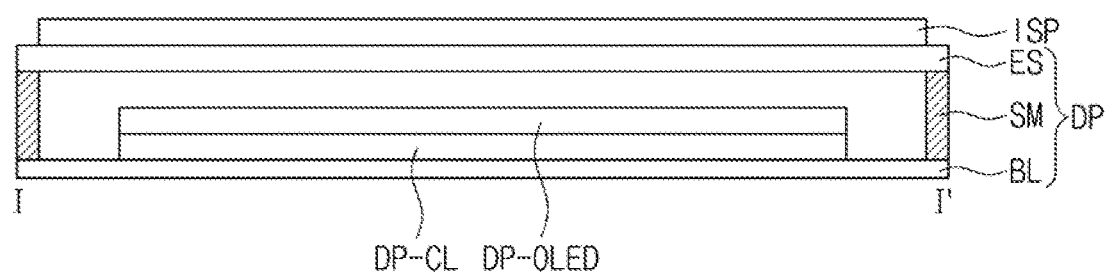
FIGS. 2C and 2D are cross-sectional views taken along a line I-I' of FIG. 1B illustrating electronic device.
Figure 2D:
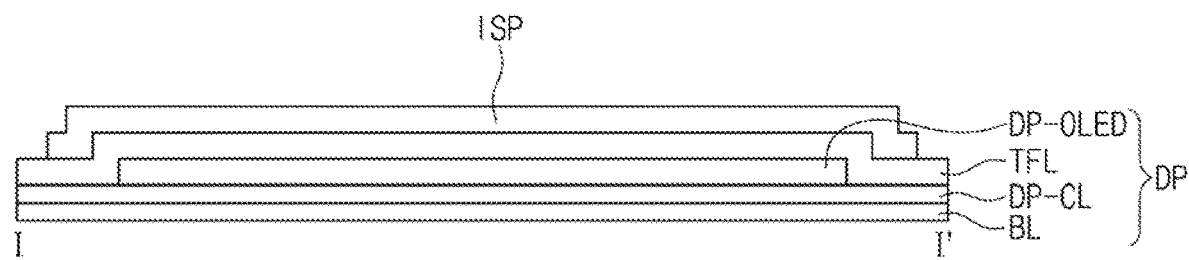

FIG. 1A is a perspective view illustrating an electronic device ELD according to an embodiment of the present disclosure, and FIG. 1B is an exploded perspective view showing the electronic device ELD according to an embodiment of the present disclosure. FIGS. 2A and 2B are cross-sectional views taken along a line I-I' of FIG. 1B illustrating the electronic device. FIGS. 2C and 2D are cross-sectional views taken along the line I-I' of FIG. 1B illustrating the electronic device.

Referring to FIGS. 1A and 1B, the electronic device ELD may be activated in response to electrical signals. The electronic device ELD may be embodied in various ways. For example, the electronic device ELD may be applied to electronic items, such as a smartphone, a tablet computer, a notebook computer, a computer monitor, a smart television, or the like.

The electronic device ELD displays an image IM through a display surface IS that is substantially parallel to each of a first direction DR1 and a second direction DR2. The display surface IS through which the image IM is displayed corresponds to a front surface of the electronic device ELD. The image IM may be a video image and/or a still image.

According to an embodiment, a front (or upper) and rear (or lower) surfaces of each member are defined with respect to a direction in which the image IM is displayed. The front and rear surfaces are opposite to each other in the third direction DR3, and a normal line direction of each of the front and rear surfaces may be substantially parallel to the third direction DR3.

A separation distance between the front surface and the rear surface in the third direction DR3 may correspond to a thickness in the third direction DR3 of the electronic device ELD. Directions indicated by the first, second, and third directions DR1, DR2, and DR3 may be changed to other directions different from the directions defined in FIG. 1A.

The electronic device ELD may sense an external input applied thereto. The external input may be one or more of various different types of input provided from outside of the electronic device ELD. The electronic device ELD, according to an embodiment, may sense a first input TC1 of a user US applied thereto. The first input TC1 of the user US may be an input generated by a user's finger and may include all inputs that cause a variation in capacitance, such as an input using a user's body. The first input ICI may include an input generated by a passive-type input device such as a passive stylus. The electronic device ELD may sense the first input TC1 of the user US, which is applied to a side or a rear surface of the electronic device ELD, depending on a structure of the electronic device ELD, and the present invention is not necessarily limited to a particular embodiment.

In addition, the electronic device ELD, according to an embodiment, may sense a second input TC2 different from the first input TC1. The second input TC2 may include inputs generated by an input device AP, e.g., a stylus pen, an active stylus, a touch pen, an electronic pen, or the like. Hereinafter, the second input TC2 is described as an input signal provided by the active stylus.

The front surface of the electronic device ELD may include an image area IA and a bezel area BZA. The image area IA may be an area through which the image IM is displayed. The user may view the image IM through the image area IA. In an embodiment, the image area IA may have a quadrilateral shape with rounded vertices, however, this is merely an example and the present invention is not necessarily limited to this particular example. The image area IA may have a variety of shapes and the present invention is not necessarily limited to having an image area IA of a particular shape.

The bezel area BZA may be adjacent to the image area IA. The bezel area BZA may have a predetermined color. The bezel area BZA may at least partially surround the image area IA. Accordingly, the image area IA may have a shape defined by the bezel area BZA, however, this is merely an example and the present invention is not necessarily limited to this particular example, and the bezel area BZA may be disposed adjacent to only one side of the image area IA or the bezel area BZA may be omitted. The electronic device ELD, according to an embodiment of the present disclosure, may be embodied in a variety of different forms and the present invention is not necessarily limited to using any particular electronic device ELD.

As shown in FIG. 1B, the electronic device ELD may include a display device DD, a window WM disposed on the display device DD, and a case EDC. The display device DD may include a display panel DP and an input sensor ISP.

The display panel DP, according to an embodiment of the present disclosure, may be a light-emitting type display panel, however, the present invention is not necessarily limited to using a light-emitting type display panel. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel is described as an example of the display panel DP.

The input sensor ISP may be disposed on the display panel DP and may obtain coordinate information of the external input, e.g., the first input TC1 and/or the second input TC2. The input sensor ISP is described in detail below.

The display device DD may include a main circuit board MCB, a flexible circuit film FCB, and a driving chip DIC. One or more of the main circuit board MCB, the flexible circuit film FCB, and the driving chip DIC may be omitted. The main circuit board MCB may be connected to the flexible circuit film FCB and the flexible circuit film FCB may be electrically connected to the display panel DP. The main circuit board MCB may include a plurality of driving elements. The driving elements may include a circuit part driving the display panel DP. The flexible circuit film FCB may be connected to the display panel DP to electrically connect the display panel DP to the main circuit board MCB. The driving chip DIC may be mounted on the flexible circuit film FCB.

The flexible circuit film FCB may be bent to allow the main circuit board MCB to face a rear surface of the display device DD. The main circuit board MCB may be electrically connected to other electronic modules of the electronic device ELD through a connector.

The driving chip DIC may include driving elements. e.g., a data driving circuit, driving pixels of the display panel DP. In an embodiment of the present disclosure, one flexible circuit film FCB is shown, however, the present invention is not necessarily limited to having only one flexible circuit film FCB. For example, the flexible circuit film FCB may be provided in plural, and the plurality of flexible circuit films may be connected to the display panel DP. FIG. 1B shows a structure in which the driving chip DIC is mounted on the flexible circuit film FCB, however, the present invention is not necessarily limited to having the driving chip DIC being mounted on the flexible circuit film FCB. For example, the driving chip DIC may be disposed directly on the display panel DP. A portion of the display panel DP may be bent, and a portion of the display panel DP on which the driving chip DIC is mounted may be disposed to face the rear surface of the display device DD.

The input sensor ISP may be electrically connected to the main circuit board MCB through an additional flexible circuit film, however, the present invention is not necessarily limited to this particular example. The input sensor ISP may be electrically connected to the display panel DP and the display panel DP may be electrically connected to the main circuit board MCB through the flexible circuit film FCB. Conductive structures electrically connecting the input sensor ISP to the display panel DP may be applied to the display device DD.

The window WM may include a transparent material that transmits the image IM therethrough. For example, a base layer of the window WM may include a glass, sapphire, or plastic material that is transmissive of visible light. The window WM may have a single-layer structure. However, the invention is not necessarily limited to a window WM having a single-layer structure, and the window WM may include a plurality of layers (e.g., it may have a multi-layer structure).

The case EDC may be a bottom protective structure of the electronic device ELD. The case EDC may be coupled to the window WM. The case EDC may absorb impact applied thereto from the outside and may prevent a foreign substance and moisture from entering the display device DD to protect components that are mounted within the case EDC. The case EDC may be formed of either one continuous structure or may include multiple structures connected to each other.

The electronic device ELD, according to an embodiment, may further include an electronic module including a variety of functional modules to drive the display device DD, a power supply module supplying a power required for an overall operation of the electronic device ELD, and a bracket coupled to the display device DD and/or the case EDC to partition an inner space of the electronic device ELD.

The above-described members may be coupled to each other by an adhesive layer ADL (refer to FIG. 2A). The adhesive layer ADL may include an optically clear adhesive film (OCA). However, the adhesive layer ADL is not necessarily limited to being an OCA, and the adhesive layer ADL may include a conventional adhesive. For example, the adhesive layer ADL may include an optically clear resin (OCR) or a pressure sensitive adhesive film (PSA).

An anti-reflective layer may be further disposed between the window WM and the display device DD. The anti-reflective layer may reduce a reflectance of an external light incident thereto from above the window WM. The anti-reflective layer, according to an embodiment of the present disclosure, may include a retarder and a polarizer. The retarder may be a film type or liquid crystal coating type and may include a half-wave (λ/2) retarder and/or a quarter-wave (λ/4) retarder. The polarizer may be a film type or liquid crystal coating type. The film type polarizer may include a stretching type synthetic resin film, and the liquid crystal coating type polarizer may include liquid crystals aligned in a predetermined alignment. The retarder and the polarizer may be implemented as one polarizing film. In an embodiment of the present disclosure, the anti-reflective layer may be disposed directly on the input sensor ISP or the display panel DP. The retarder and/or the polarizer may include color filters that are internalized (e.g., part of the element).

The display device DD may display the image in response to electrical signals and may transmit/receive information about the external input. The display device DD may include an active area AA and a peripheral area NAA. The image may be displayed through the active area AA, and the external input may be sensed in the active area AA. The active area AA and the peripheral area NAA may respectively correspond to (and may be aligned with) the image area IA and the bezel area BZA shown in FIG. 1A. In the following descriptions, the expression "an area/portion corresponds to another area/portion" means that "an area/portion overlaps another area/portion", but the expression is not necessarily limited to "an area/portion has the same area and/or the same shape as another area/portion".

The peripheral area NAA may be defined adjacent to the active area AA. For example, the peripheral area NAA may T least partially surround the active area AA. However, this is merely an example, the present invention is not necessarily limited to this particular example, and the peripheral area NAA may be defined in various shapes. According to an embodiment, the active area AA of the display device DD may correspond to at least a portion of the image area IA.

Referring to FIG. 2A, the input sensor ISP may be disposed directly on the display panel DP. According to an embodiment of the present disclosure, the input sensor ISP may be formed on the display panel DP through successive processes. For example, when the input sensor ISP is disposed directly on the display panel DP, an adhesive layer might not be disposed between the input sensor ISP and the display panel DP. However, as shown in FIG. 2B, an adhesive layer ADL may be disposed between an input sensor ISP and a display panel DP. In this case, the input sensor ISP might not be formed through the successive processes with the display panel DP and may be fixed on an upper surface of the display panel DP by the adhesive layer ADL after being formed through a separate process from the display panel DP.

As shown in FIG. 2A, the window WM may include a light blocking pattern WBM to define the bezel area BZA (refer to FIG. 1A). The light blocking pattern WBM may be a colored organic layer and may be formed on a lower surface of a base layer WM-BS by a coating method.

As shown in FIG. 2C, a display panel DP may include a base layer BL, a circuit element layer DP-CL disposed on the base layer BL, a display element layer DP-OLED, an encapsulation substrate EC, and a sealant SM that bonds the base layer BL and the encapsulation substrate EC to one another.

The base layer BL may include at least one plastic film. The base layer BL may include a plastic substrate, a glass substrate, a metal substrate, or an organic/inorganic composite substrate. According to an embodiment, the base layer BL may be a thin film glass substrate having a thickness on the order of tens to hundreds of micrometers. The base layer BL may have a multi-layer structure. For instance, the base layer BL may include the multi-layer structure of polyimide layer/at least one inorganic layer/polyimide layer.

The circuit element layer DP-CL may include at least one insulating layer and a circuit element. The insulating layer may include at least one inorganic layer and at least one organic layer. The circuit element may include signal lines and a driving circuit of the pixels. This is described in detail below.

The display element layer DP-OLED may include at least a light emitting element, for example, organic light emitting diodes. The display element layer DP-OLED may further include an organic layer such as a pixel definition layer.

The encapsulation substrate ES may be spaced apart from the display element layer DP-OLED by a gap GP of a predetermined size. The base layer BL and the encapsulation substrate ES may include a plastic substrate, a glass substrate, a metal substrate, or an organic/inorganic composite substrate. The sealant SM may include an organic adhesive or a frit. The gap GP may be filled with a predetermined material. For example, a desiccant or resin material may be filled in the gap GP.

As shown in FIG. 2D, a display panel DP may include a base layer BL, a circuit element layer DP-CL disposed on the base layer BL, a display element layer DP-OLED, and an upper insulating layer TFL. The upper insulating layer TFL may include a plurality of thin layers. Some layers may be disposed to increase an optical efficiency, and the other layers may be disposed to protect organic light emitting diodes. The upper insulating layer TFL may include at least an inorganic layer/organic layer/inorganic layer.

Figure 3A:
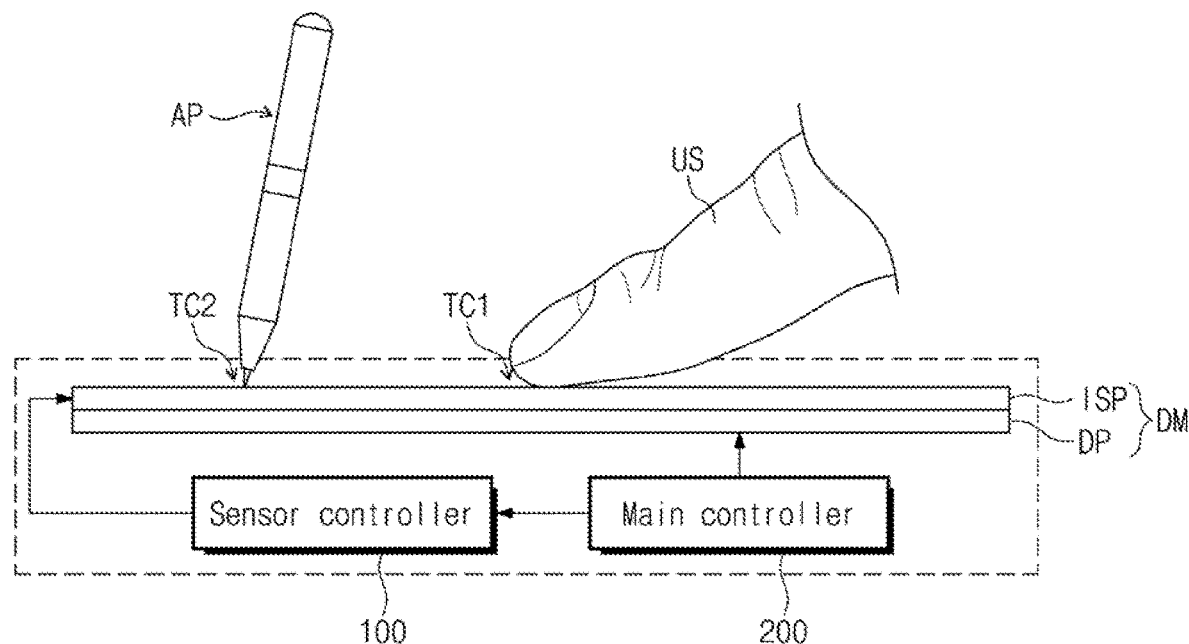
FIG. 3A is a block diagram illustrating an operation of an electronic device according to an embodiment of the present disclosure.
Figure 3B:
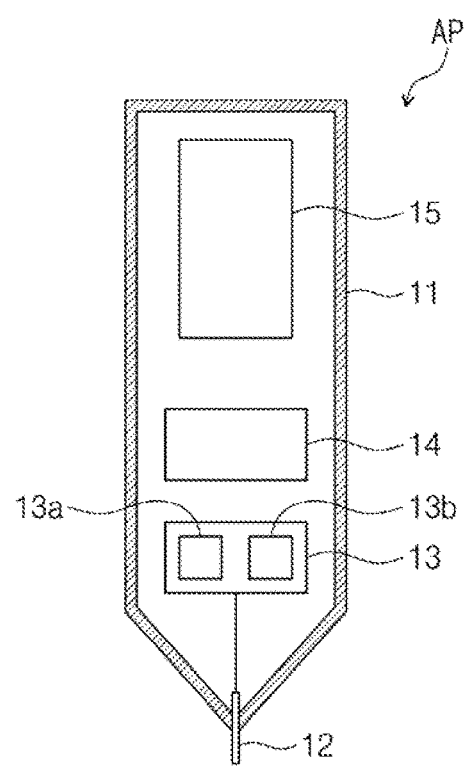
FIG. 3B is a block diagram illustrating an input device shown in FIG. 3A.

FIG. 3A is a block diagram illustrating an operation of the electronic device according to an embodiment of the present disclosure, and FIG. 3B is a block diagram illustrating the input device shown in FIG. 3A.

Referring to FIGS. 3A and 3B, the electronic device ELD, according to an embodiment of the present disclosure, further includes a main controller 200 driving the display device DD and a sensor controller 100 connected to the input sensor ISP. The main controller 200 may drive the sensor controller 100. According to an embodiment of the present disclosure, the main controller 200 and the sensor controller 100 may each be mounted on the main circuit board MCB (refer to FIG. 1B). According to an embodiment of the present disclosure, the sensor controller 100 may be built into the driving chip DIC (refer to FIG. 1B).

The input sensor ISP may include sensing electrodes. The sensing electrodes may include a first group of sensing electrodes and a second group of sensing electrodes. The input sensor ISP is described in detail below.

The sensor controller 100 may be connected to the sensing electrodes of the input sensor ISP. The sensor controller 100 may operate the input sensor ISP in a first mode to sense the first input TC1 (refer to FIG. 1A) and may operate the input sensor ISP in a second mode to sense the second input TC2 (refer to FIG. 1A).

As shown in FIG. 3B, the input device AP may include a housing 11, a conductive tip 12, and a communication module 13. The housing 11 may have a pen shape and may be provided with an accommodation space defined therein. The conductive tip 12 may protrude outwardly through one side of the housing 11, which is opened. The conductive tip 12 may be a portion of the input device AP that is in direct contact with the input sensor ISP.

The communication module 13 may include a transmission circuit 13a and a reception circuit 13b. The transmission circuit 13a may transmit a downlink signal to the sensor controller 100. The downlink signal may include a position of the input device AP relative to a flat surface of the window WM, a slope of the input device AP relative to a flat surface of the window WM, state information, and the like. The sensor controller 100 may receive the downlink signal via the input sensor ISP when the input device AP is in contact with the input sensor ISP.

The reception circuit 13b may receive an uplink signal from the sensor controller 100. The uplink signal may include information such as panel information, a protocol version, etc. The sensor controller 100 may provide the uplink signal to the input sensor ISP, and the input device AP may receive the uplink signal through the contact with the input sensor ISP.

The input device AP further includes an input controller 14 to drive the input device AP. The input controller 14 may be configured to operate according to a specific program. The transmission circuit 13a receives a signal provided from the input controller 14 and modulates the signal into a signal that may be sensed by the input sensor ISP, and the reception circuit 13b modulates the signal applied thereto via the input sensor ISP into a signal that may be processed by the input controller 14. The input device AP may further include a power module 15 to supply a power to the input device AP.

Figure 4:
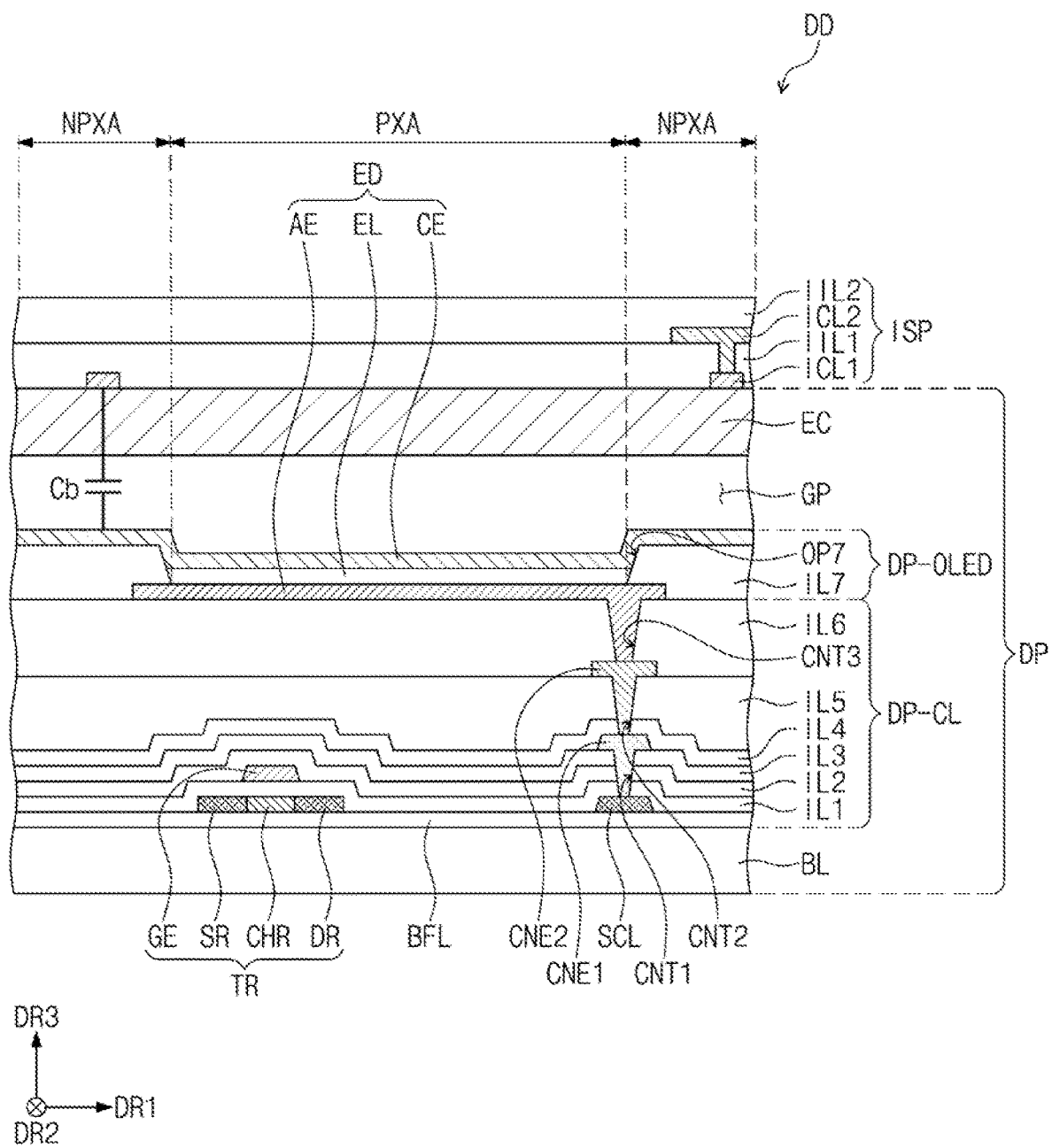
FIG. 4 is an enlarged cross-sectional view illustrating a display device according to an embodiment of the present disclosure.

FIG. 4 is an enlarged cross-sectional view showing the display device DD according to an embodiment of the present disclosure.

Referring to FIG. 4, the display device DD may include the display panel DP and the input sensor ISP disposed directly on the display panel DP. The adhesive layer might not be disposed between the display panel DP and the input sensor ISP. The display panel DP may include the base layer BL, the circuit element layer DP-CL, the display element layer DP-OLED, and the encapsulation substrate EC.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, and a signal line. An insulating layer, a semiconductor layer, and a conductive layer may be formed on the base layer BL by a coating or depositing process. Then, the insulating layer, the semiconductor layer, and the conductive layer may be selectively patterned through one or more photolithography processes. The semiconductor pattern, the conductive pattern, and the signal line included in the circuit element layer DP-CL may be so-formed.

At least one inorganic layer may be formed on an upper surface of the base layer BL. The inorganic layer may include aluminum oxide, titanium oxide, silicon oxide, silicon oxynitride, zirconium oxide, and/or hafnium oxide. The inorganic layer may be formed in multiple layers. The inorganic layers may form a barrier layer and/or a buffer layer. According to an embodiment, the display panel DP may include a buffer layer BFL.

The buffer layer BFL may increase a coupling force between the base layer BL and the semiconductor pattern. The buffer layer BFL may include a silicon oxide layer and a silicon nitride layer, and the silicon oxide layer and the silicon nitride layer may be alternately stacked upon each other.

The semiconductor pattern may be disposed on the buffer layer BFL. The semiconductor pattern may include polysilicon, however, the present invention is not necessarily limited to using a semiconductor pattern that includes polysilicon. The semiconductor pattern may include amorphous silicon or metal oxide.

FIG. 4 shows only a portion of the semiconductor pattern, and the semiconductor pattern may be further disposed in other areas. The semiconductor pattern may be arranged over the pixels according to a particular configuration. The semiconductor pattern may have different electrical properties depending on whether it is doped or not or whether it is doped with an N-type dopant or a P-type dopant. The semiconductor pattern may include a first region having high conductivity and a second region having low conductivity. The first region may be doped with the N-type dopant or the P-type dopant. A P-type transistor may include a doped region doped with the P-type dopant. The second region may be a non-doped region or may be doped at a lower concentration of dopant as compared with the first region.

The first region may a the conductivity that is greater than that of the second region and may substantially serve as an electrode or signal line. The second region may substantially correspond to an active area (or a channel area) of the transistor. For example, a portion of the semiconductor pattern may be the active area of the transistor, and other portions of the semiconductor pattern may be a source area or a drain area of the transistor.

Each of the pixels may have an equivalent circuit that includes seven transistors, one capacitor, and a light emitting element, and the equivalent circuit may be changed in various ways. FIG. 4 shows one transistor TR and the light emitting element ED included in the pixel.

A source area SR, a channel area CHR, and a drain area DR of the transistor TR may be formed from the semiconductor pattern. The source area SR and the drain area DR may extend in opposite directions to each other from the channel area CHR in a cross-sectional view. FIG. 4 shows a portion of a signal line SCL disposed on the same layer as the semiconductor pattern. The signal line SCL may be electrically connected to the transistor TR when viewed in a plane.

A first insulating layer IL1 may be disposed on the buffer layer BFL. The first insulating layer IL1 may commonly overlap the pixels (e.g., a single first insulating layer IL1 may overlap all pixels) and may at least partially cover the semiconductor pattern. The first insulating layer IL1 may be an inorganic layer and/or an organic layer and may have a single-layer or multi-layer structure. The first insulating layer IL1 may include aluminum oxide, titanium oxide, silicon oxide, silicon nitride, silicon oxynitride, zirconium oxide, and/or hafnium oxide. According to an embodiment, the first insulating layer IL1 may have a single-layer structure of a silicon oxide layer. Not only the first insulating layer IL1, but also an insulating layer of the circuit element layer DP-CL described later below be an inorganic layer and/or an organic layer and may have a single-layer or multi-layer structure. The inorganic layer may include at least one of the above-mentioned materials, however, the present invention is not necessarily limited thereto.

A gate GE of the transistor TR may be disposed on the first insulating layer IL1. The gate GE may be a portion of a metal pattern. The gate GE may at least partially overlap the channel area CHR. The gate GE may be used as a mask in a process of doping the semiconductor pattern.

A second insulating layer IL2 may be disposed on the first insulating layer IL1 and may at least partially cover the gate GE. The second insulating layer IL2 may commonly overlap the pixels (e.g., a single second insulating layer IL2 may overlap all pixels). The second insulating layer IL2 may be an inorganic layer and/or an organic layer and may have a single-layer or multi-layer structure. According to an embodiment, the second insulating layer IL2 may have a single-layer structure of a silicon oxide layer.

A third insulating layer IL3 may be disposed on the second insulating layer IL2. According to an embodiment, the third insulating layer IL3 may have a single-layer structure of a silicon oxide layer. A first connection electrode CNE1 may be disposed on the third insulating layer IL3. The first connection electrode CNE1 may be connected to the signal line SCL through a contact hole CNT1 defined through the first, second, and third insulating layers IL1, IL2, and IL3.

A fourth insulating layer IL4 may be disposed on the third insulating layer IL3. The fourth insulating layer IL4 may have a single-layer structure of a silicon oxide layer. A fifth insulating layer IL5 may be disposed on the fourth insulating layer IL4. The fifth insulating layer IL5 may be an organic layer.

A second connection electrode CNE2 may be disposed on the fifth insulating layer IL5. The second connection electrode CNE2 may be connected to the first connection electrode CNE1 through a contact hole CNT2 defined through the fourth insulating layer IL4 and the fifth insulating layer 115.

A sixth insulating layer IL6 may be disposed on the fifth insulating layer IL5 and may at least partially cover the second connection electrode CNE2. The sixth insulating layer IL6 may be an organic layer. The display element layer DP-OLED may be disposed on the circuit element layer DP-CL. The display element layer DP-OLED may include the light emitting element ED. For example, the display element layer DP-OLED may include an organic light emitting material, a quantum dot, a quantum rod, a micro LED, or a nano LED. The light emitting element ED may include a first electrode AE, an emission layer EL, and a second electrode CE.

The first electrode AE may be disposed on the sixth insulating layer IL6. The first electrode AE may be connected to the second connection electrode CNE2 through a contact hole CNT3 defined through the sixth insulating layer IL6.

A pixel definition layer IL7 may be disposed on the sixth insulating layer IL6 and may cover a portion of the first electrode AE. An opening OP7 may be defined through the pixel definition layer IL7. At least a portion of the first electrode AE may be exposed through the opening OP7 of the pixel definition layer IL7. According to an embodiment, an emission area PXA may correspond to the portion of the first electrode AE exposed through the opening OP7. A non-emission area NPXA may at least partially surround the emission area PXA.

The emission layer EL may be disposed on the first electrode AE. The emission layer EL may be disposed in the opening OP7. For example, the emission layer EL may be formed in each of the pixels after being divided into plural portions. When the emission layer EL is formed in each of the pixels after being divided into plural portions, each of the emission layers EL may emit light having at least one of blue, red, and green colors, however, the present invention is not necessarily limited thereto or thereby. The emission layer EL may be connected to the pixels and may be commonly provided. In this case, the emission layer EL may provide a blue light or a white light.

The second electrode CE may be disposed on the emission layer EL. The second electrode CE may have an integral shape and may be commonly disposed over the pixels. A common voltage may be applied to the second electrode CE, and the second electrode CE may be referred to as a common electrode.

A hole control layer may be disposed between the first electrode AE and the emission layer EL. The hole control layer may be commonly disposed in the emission area PXA and the non-emission area NPXA. The hole control layer may include a hole transport layer and may further include a hole injection layer. An electron control layer may be disposed between the emission layer EL and the second electrode CE. The electron control layer may include an electron transport layer and may further include an electron injection layer. The hole control layer and the electron control layer may be commonly formed in the plural pixels using an open mask.

The input sensor ISP may be directly formed on an upper surface of the encapsulation substrate ES through successive processes. The input sensor ISP may include a first conductive layer ICL1, a first sensor insulating layer IIL1, a second conductive layer ICL2, and a second sensor insulating layer IIL2. According to an embodiment of the present disclosure, an inorganic layer may be further disposed between the upper surface of the encapsulation substrate ES and the first conductive layer ICL1.

Each of the first and second conductive layers ICL1 and ICL2 may have a single-layer structure or a plurality of patterns having a multi-layer structure of layers stacked in the third direction DR3. The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The first sensor insulating layer IIL1 may at least partially cover the first conductive layer ICL1, and the second sensor insulating layer IIL2 may at least partially cover the second conductive layer ICL2. The first sensor insulating layer IIL1 and the second sensor insulating layer IIL2 have the single-layer structure, however, the present invention is not necessarily limited thereto or thereby.

The first sensor insulating layer IIL1 and/or the second sensor insulating layer IIL2 may include an inorganic layer. The inorganic layer may include aluminum oxide, titanium oxide, silicon oxide, silicon nitride, silicon oxynitride, zirconium oxide, and/or hafnium oxide.

The first sensor insulating layer IIL1 and/or the second sensor insulating layer IIL2 may include an organic layer. The organic layer may include an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and/or a perylene-based resin.

Figure 5:
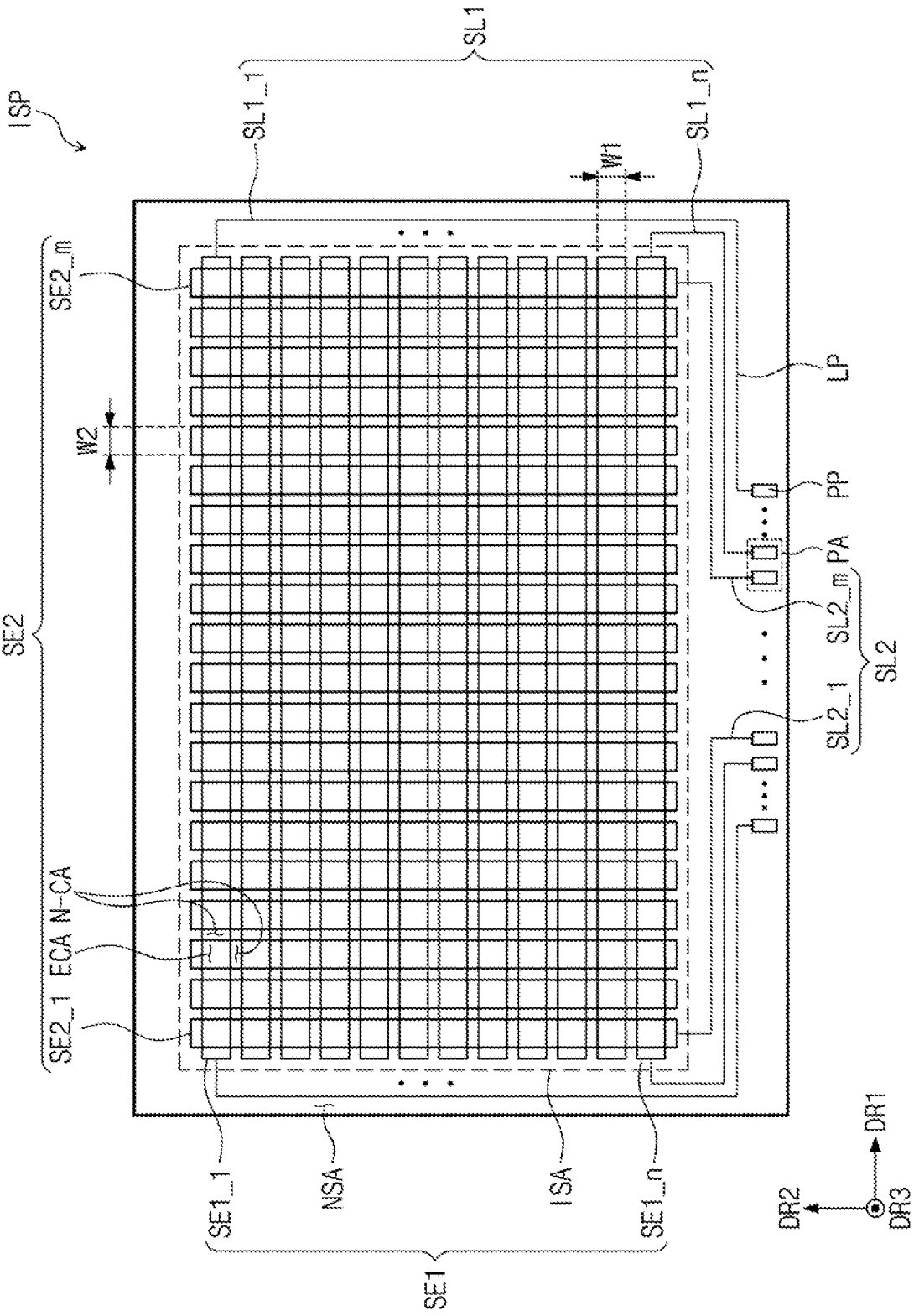
FIG. 5 is a plan view illustrating an input sensor according to an embodiment of the present disclosure.
Figure 6:
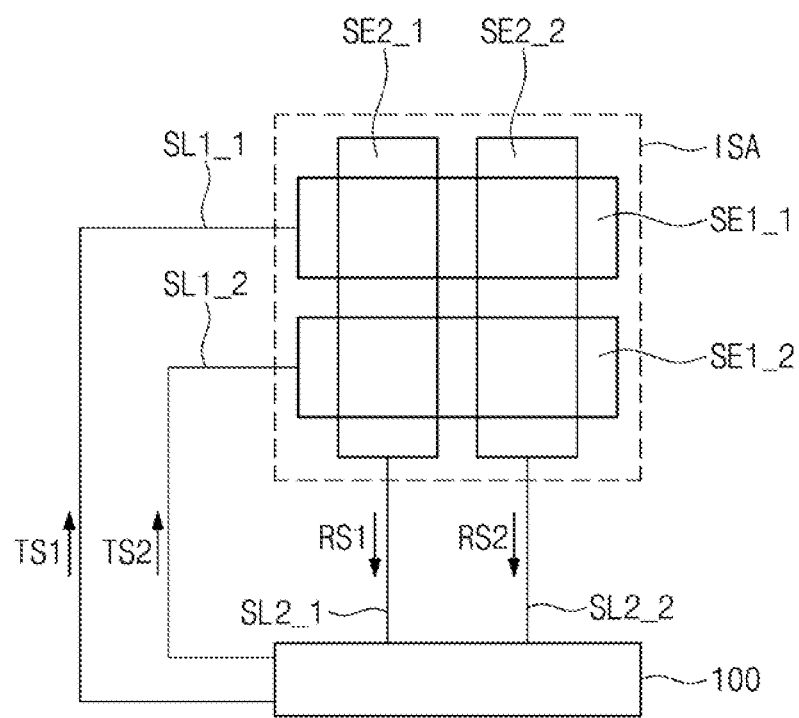
FIG. 6 is a schematic diagram illustrating an operation of an input sensor in a first mode.
Figure 7A:
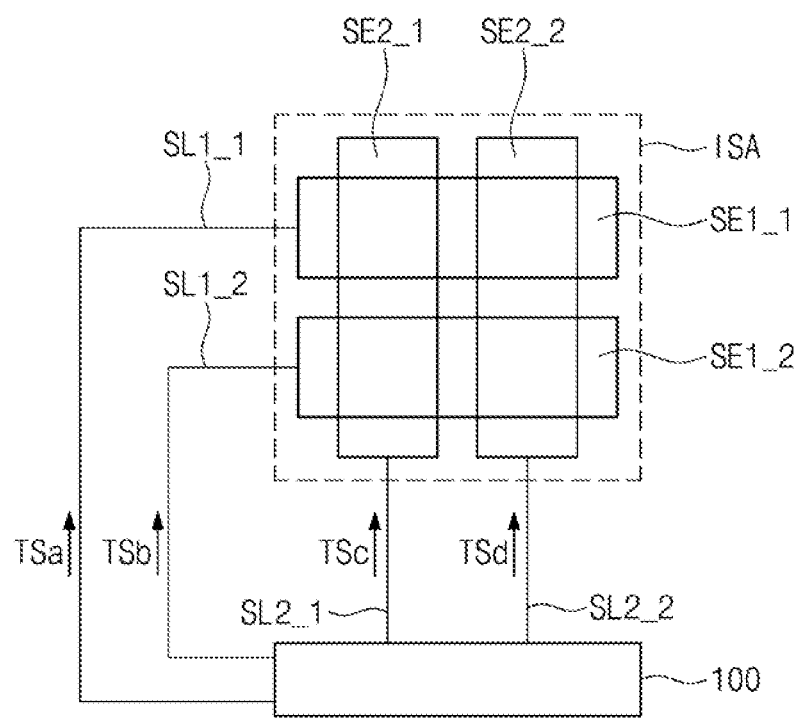
FIGS. 7A and 7B are schematic diagrams illustrating an operation of an input sensor in a second mode.
Figure 7B:
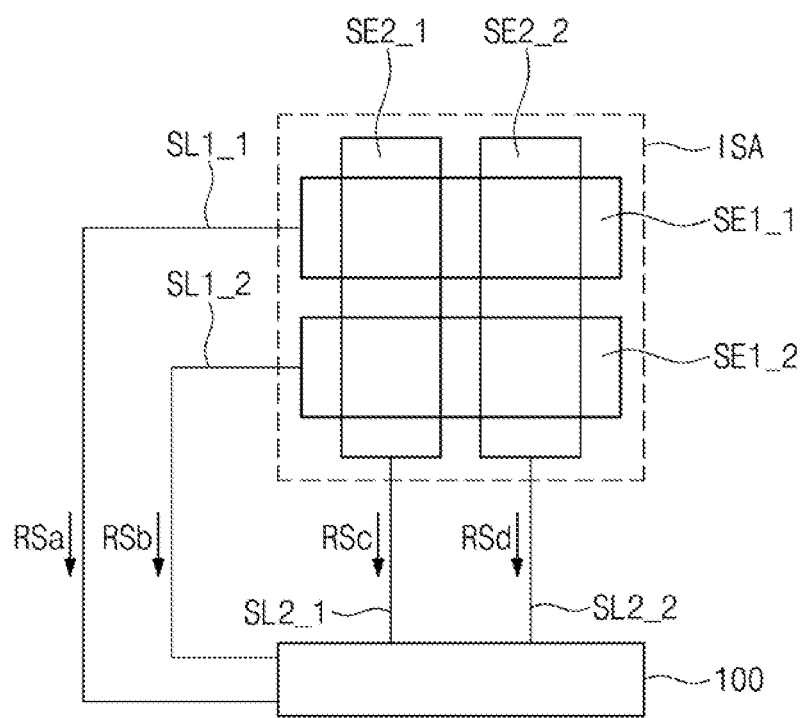

FIG. 5 is a plan view illustrating the input sensor ISP according to an embodiment of the present disclosure. FIG. 6 is a schematic diagram illustrating an operation of the input sensor in the first mode. FIGS. 7A and 7B are schematic diagrams illustrating an operation of the input sensor in the second mode. Hereinafter, the input sensor ISP is described in detail with reference to FIGS. 3A, 5, 6, 7A, and 7B.

Referring to FIGS. 3A and 5, the input sensor ISP may include a sensing area ISA and a non-sensing area NSA. The sensing area ISA may be activated in response to electrical signals. The sensing area ISA and the non-sensing area NSA may respectively correspond to the active area AA and the peripheral area NAA of the display device DD shown in FIG. 1B.

The input sensor ISP may include first sensing electrodes SE1_1 to SE1_$n$ (hereinafter, referred to as first electrodes) and second sensing electrodes SE2_1 to SE2_$m$ (hereinafter, referred to as second electrodes). The first electrodes SE1_1 to SE1_$n$ may be electrically insulated from the second electrodes SE2_1 to SE2_$m$ and may cross the second electrodes SE2_1 to SE2_$m$. Areas where the first electrodes SE1_1 to SE1_$n$ cross the second electrodes SE2_1 to SE2_$m$ may be defined as electrode-crossing areas ECA. Areas where the first electrodes SE1_1 to SE1_$n$ do not cross the second electrodes SE2_1 to SE2_$m$ may be defined as non-crossing areas N-CA. According to an embodiment, the first electrodes SE1_1 to SE1_$n$ may be longer than the second electrodes SE2_1 to SE2_$m$, and the number of the first electrodes SE1_1 to SE1_$n$ may be smaller than that of the second electrodes SE2_1 to SE2_$m$, however, the present invention is not necessarily limited thereto or thereby.

Each of the first electrodes SE1_1 to SE1_$n$ may have a bar shape or a stripe shape and may extend primarily in the first direction DR1. The first electrodes SE1_1 to SE1_$n$ may be arranged in the second direction DR2 and may be spaced apart from each other. The first electrodes SE1_1 to SE1_$n$ may have a substantially constant width W1 in the second direction DR2. The interval between the first electrodes SE1_1 to SE1_$n$ may be constant in the second direction DR2.

Each of the second electrodes SE2_1 to SE2_$m$ may have a bar shape or a stripe shape and may extend in the second direction DR2. The second electrodes SE2_1 to SE2_$m$ may be arranged in the first direction DR1 and may be spaced apart from each other. The second electrodes SE2_1 to SE1_$m$ may have a substantially constant width W2 in the first direction DR1. The interval between the second electrodes SE2_1 to SE2_$m$ may be constant in the first direction DR1.

The input sensor ISP may be operated in the first mode in which the input sensor ISP obtains information on the first input TC (refer to FIG. 3A) based on a variation in capacitance between the first electrodes SE1_1 to SE1_$n$ and the second electrodes SE2_1 to SE2_$m$ or in the second mode in which the input sensor ISP obtains information on the second input TC2 (refer to FIG. 3A) based on a variation in capacitance of each of the first electrodes SE1_1 to SE1_$n$ and the second electrodes SE2_1 to SE2_$m$.

The input sensor ISP may further include a plurality of first sensing signal lines SL1_1 to SL1_$n$ (hereinafter, referred to as first signal lines) and a plurality of second sensing signal lines SL2_1 to SL2_$m$ (hereinafter, referred to as second signal lines). The first signal lines SL1_1 to SL1_$n$ and the second signal lines SL2_1 to SL2_$m$ may be arranged in the non-sensing area NSA. The first signal lines SL1_1 to SL1_$n$ may be electrically connected to both sides of the first electrodes SE1_1 to SE1_$n$, respectively, and the second signal lines SL2_1 to SL2_$m$ may be electrically connected to one side of the second electrodes SE2_1 to SE2_$m$. According to an embodiment of the present disclosure, the first signal lines SL1_1 to SL1_$n$ may be connected to only one side of the first electrodes SE1_1 to SE1_$n$.

The first electrodes SE1_1 to SE1_$n$ may be electrically connected to the sensor controller 100 via the first signal lines SL1_1 to SL1_$n$, and the second electrodes SE2_1 to SE2_$m$ may be electrically connected to the sensor controller 100 via the second signal lines SL2_1 to SL2_$m$. Each of the first signal lines SL1_1 to SL1_$n$ and each of the second signal lines SL2_1 to SL2_$m$ may include a line portion LP and a pad portion PP. The pad portion PP may be connected to the flexible circuit film FCB shown in FIG. 1B.

In the first mode, according to an embodiment of the present disclosure, one of the first electrodes SE1_1 to SE1_$n$ and the second electrodes SE2_1 to SE2_$m$ may be operated as a transmission electrode, and the other of the first electrodes SE1_1 to SE1_$n$ and the second electrodes SE2_1 to SE2_$m$ may be operated as a reception electrode. In FIGS. 5 and 6, the second electrodes SE2_1 to SE2_$m$ are shown as the reception electrode. FIGS. 6 to 7B show two electrodes SE1_1 and SE1_2 among the first electrodes SE1_1 to SE1_$n$ and two electrodes SE2_1 and SE2_2 among the second electrodes SE2_1 to SE2_$m$. In the first mode, the sensor controller 100 may sense a variation in mutual capacitance between the first electrodes SE1_1 to SE1_$n$ and the second electrodes SE2_1 to SE2_$m$ to sense the external input.

In the first mode, the sensor controller 100 may apply driving signals TS1 and TS2 to the first electrodes SE1_1 to SE1_$n$. The driving signals TS1 and TS2 are shown as being applied to first ends of the first electrodes SE1_1 to SE1_$n$, however, the driving signals TS1 and TS2 may be substantially simultaneously applied to both ends of each of the first electrodes SE1_1 to SE1_$n$. In the first mode, the sensor controller 100 may receive sensing signals RS1 and RS2 from the second electrodes SE2_1 to SE2_$m$. Accordingly, the sensor controller 100 may compare the driving signals TS1 and TS2 with the sensing signals RS1 and RS2 corresponding to the driving signals TS1 and TS2 and may generate a coordinate values of a position where the first input TC1 is provided based on the variation between them.

Referring to FIGS. 5, 7A, and 7B, when the input device AP approaches the input sensor ISP, the input sensor ISP may enter the second mode to sense the second input TC2. The input device AP may communicate data with the sensor controller 100 through the input sensor ISP.

In the second mode, each of the first electrodes SE1_1 to SE1_$n$ and the second electrodes SE2_1 to SE2_$m$ may serve as the transmission electrode to provide uplink signals TSa, TSb, TSc, and TSd, which are provided from the sensor controller 100, to the input device AP. In the second mode, each of the first electrodes SE1_1 to SE1_$n$ and the second electrodes SE2_1 to SE2_$m$ may serve as the reception electrode to provide downlink signals RSa, RSb, RSc, and RSd, which are provided from the input device AP, to the sensor controller 100. For example, all the first electrodes SE1_1 to SE1_$n$ and the second electrodes SE2_1 to SE2_$m$ may serve as the transmission electrode or the reception electrode in the second mode.

When each of the first electrodes SE1_1 to SE1_$n$ and the second electrodes SE2_1 to SE2_$m$ are provided in the bar shape, a variation in mutual capacitance between the first electrodes SE1_1 to SE1_$n$ and the second electrodes SE2_1 to SE2_$m$ may be substantially uniformly maintained even though the input device AP moves. Accordingly, although the second input TC2 moves, the movement of the second input TC2 may be accurately sensed in the second mode. For example, as in the case of writing words or drawing a picture by using the input device AP, the second input TC2 provided in a line shape may be prevented from being distorted due to the variation in mutual capacitance, and as a result, a linearity of the second input TC2 may be increased.

Figure 8B:
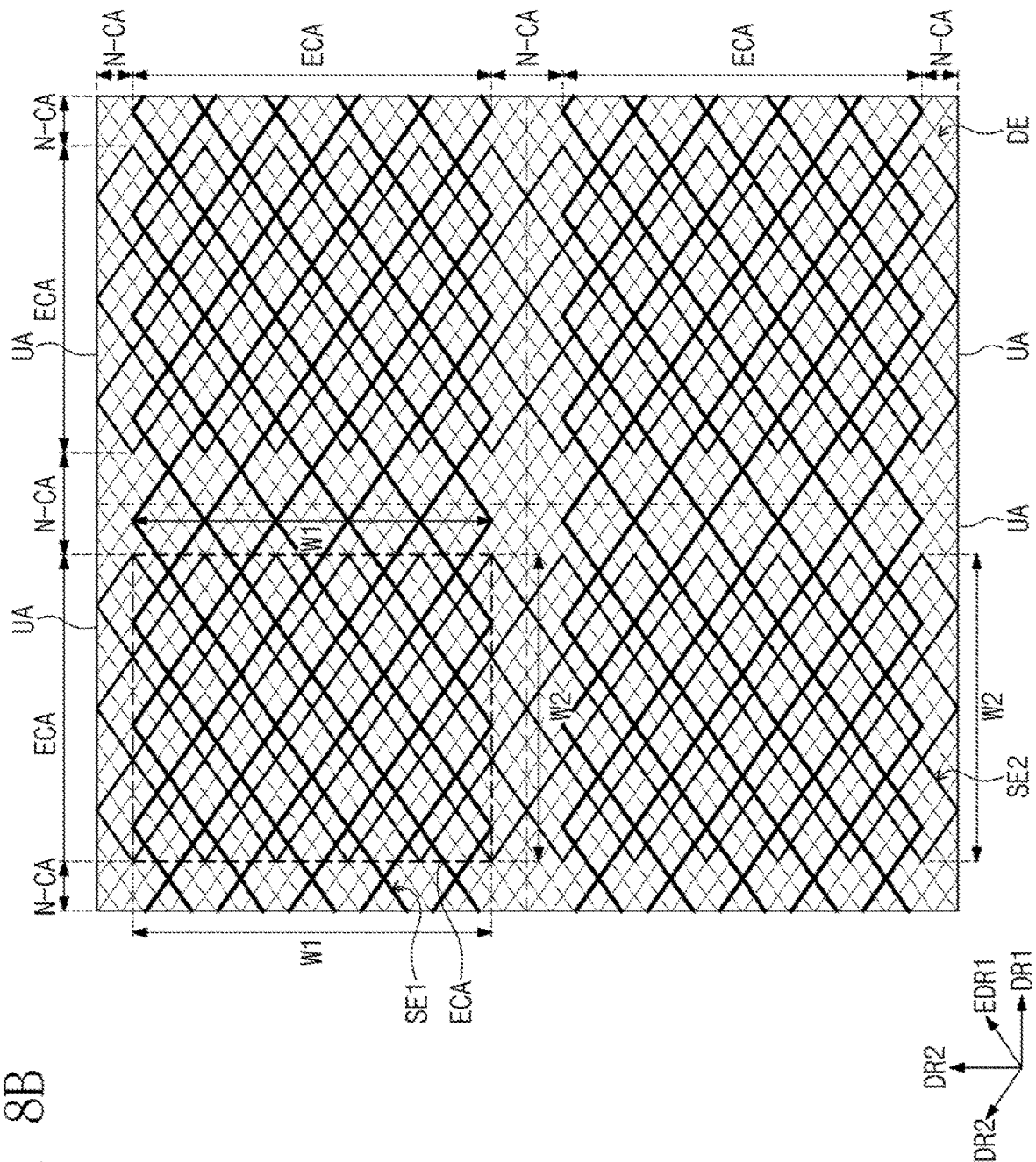
FIG. 8B is an enlarged plan view illustrating four unit sensing areas shown in FIG. 8A.
Figure 8C:
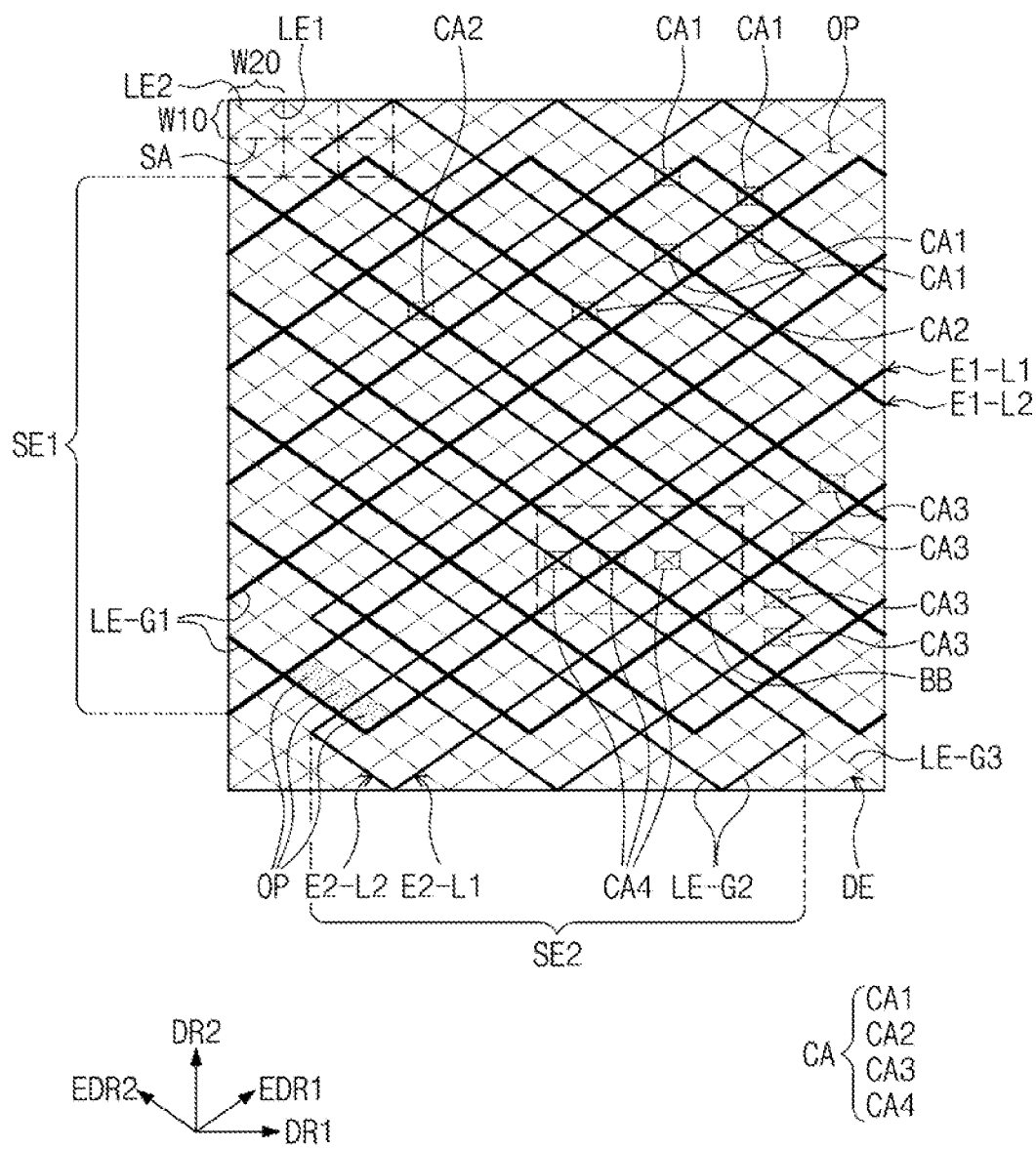
FIG. 8C is an enlarged plan view illustrating one unit sensing area shown in FIG. 8B.
Figure 8D:
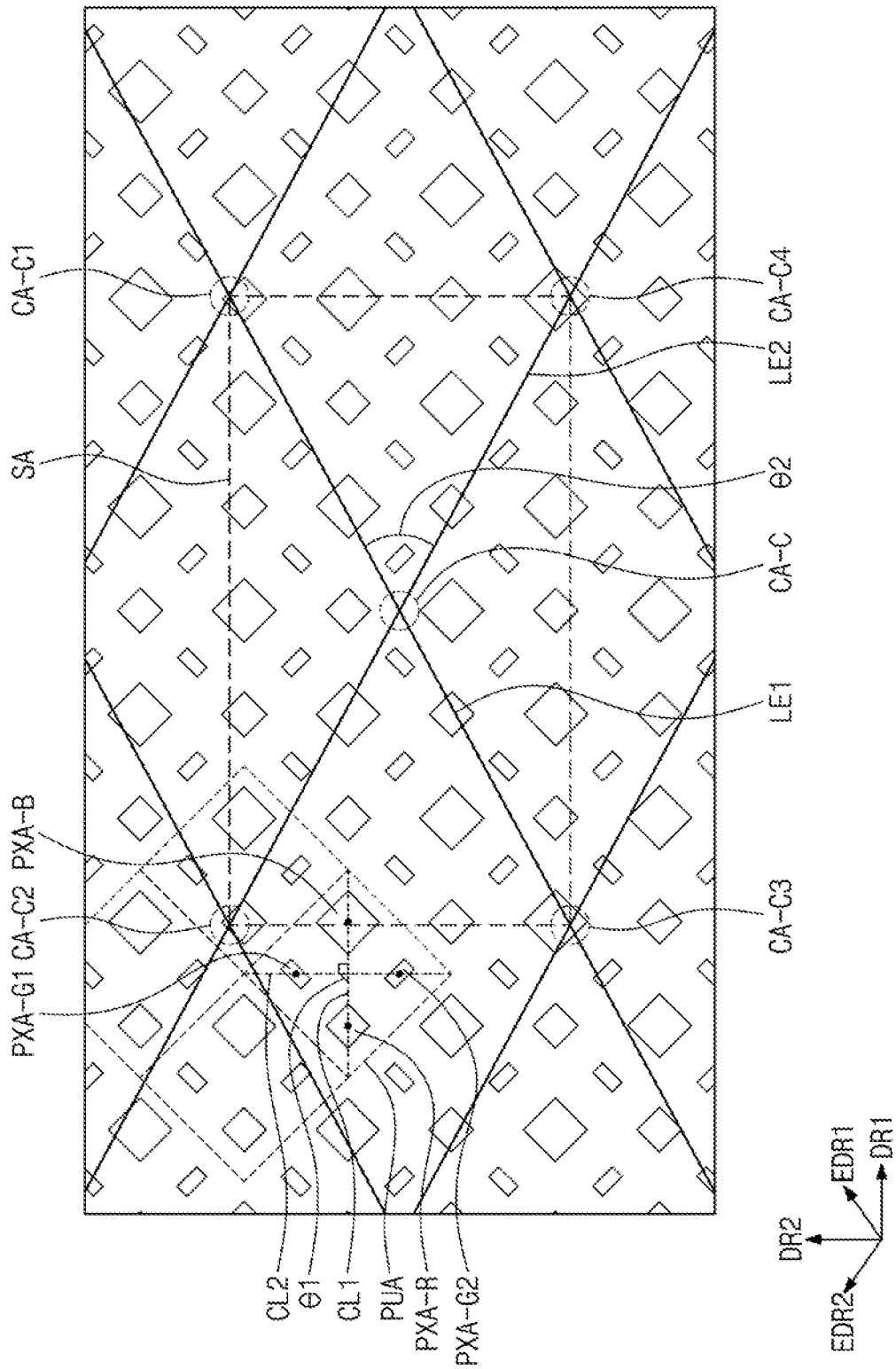
FIG. 8D is an enlarged plan view illustrating a cell area shown in FIG. 8C.
Figure 8E:
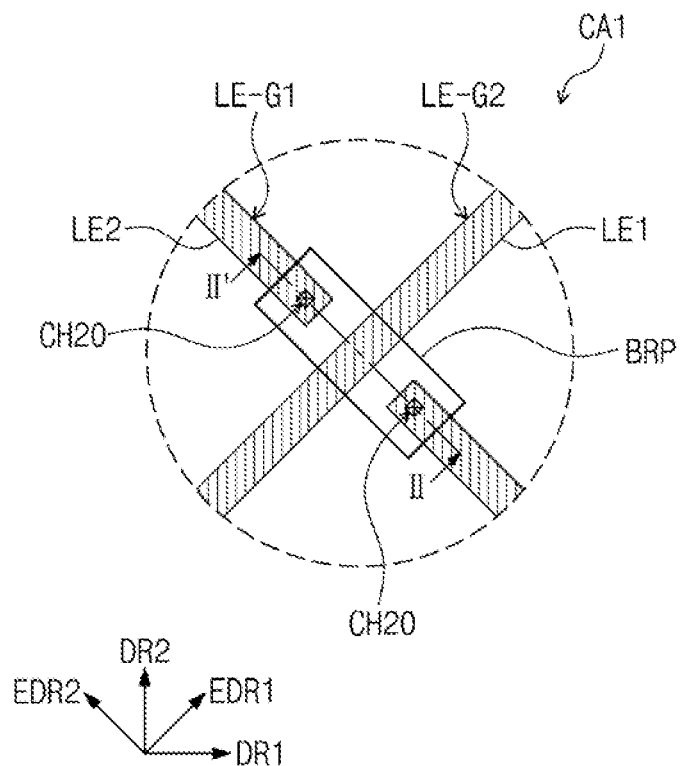
FIG. 8E is an enlarged plan view illustrating a first group area shown in FIG. 8C.
Figure 8F:
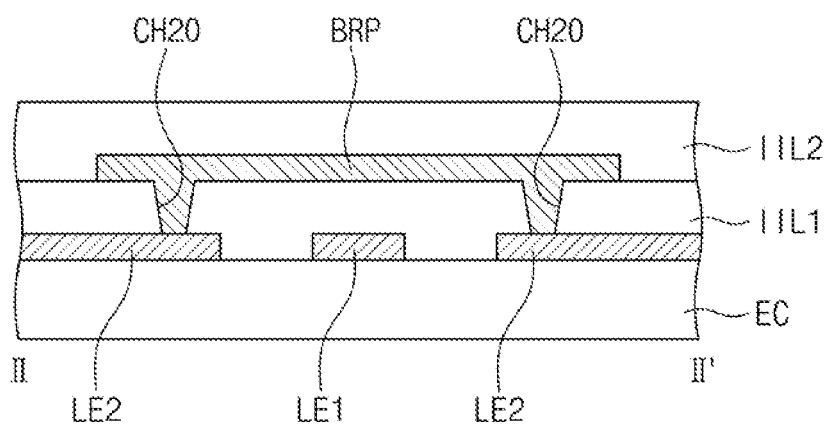
FIG. 8F is a cross-sectional view taken along a line 11-1P' of FIG. 8E illustrating an input sensor.
Figure 8G:
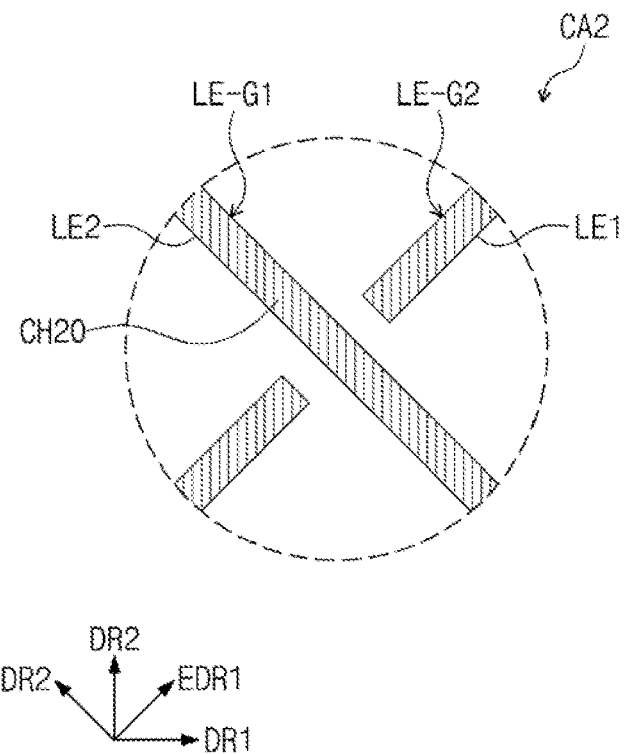
FIG. 8G is an enlarged plan view illustrating a second group area shown in FIG. 8C.
Figure 8H:
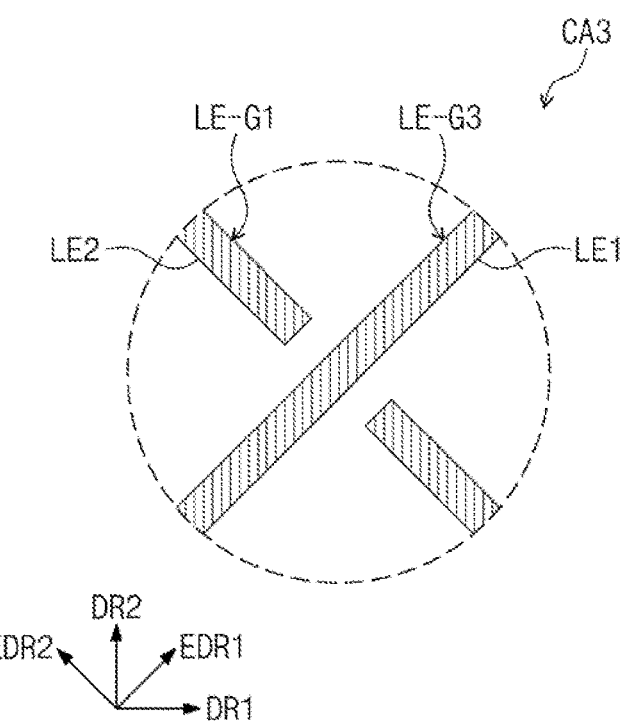
FIG. 8H is an enlarged plan view illustrating a third group area shown in FIG. 8C.
Figure 8I:
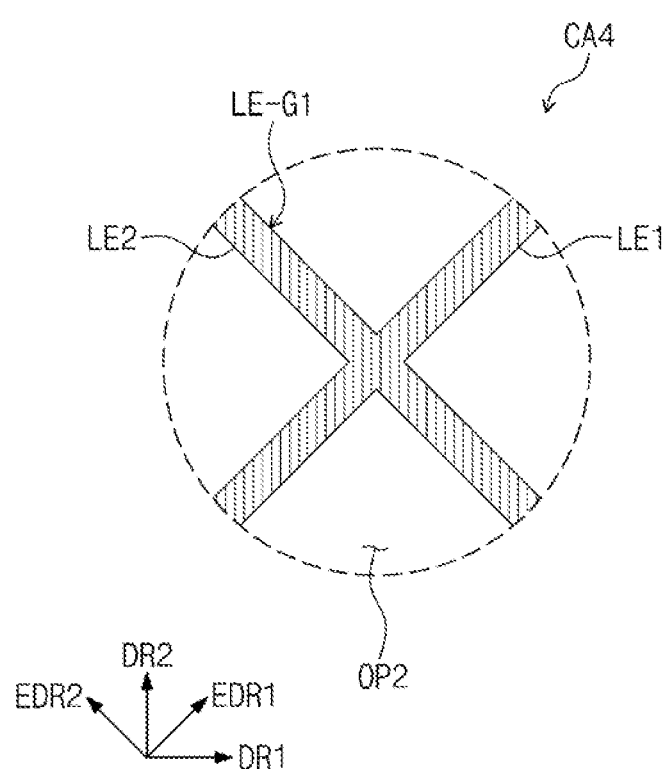
FIG. 8I is an enlarged plan view illustrating a fourth group area shown in FIG. 8C.
Figure 8K:
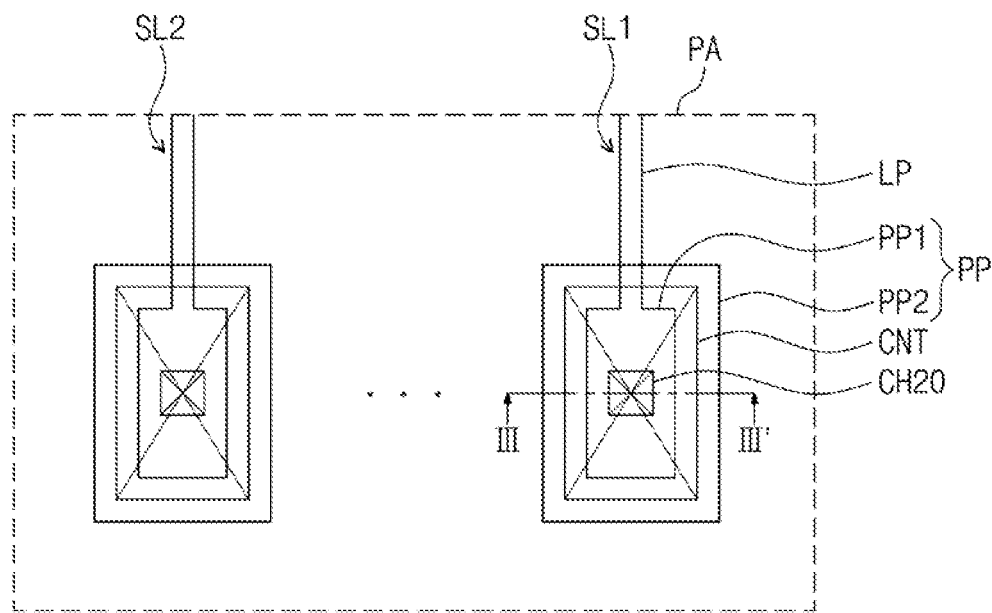
FIG. 8K is an enlarged plan view illustrating a pad area shown in FIG. 5.
Figure 8L:
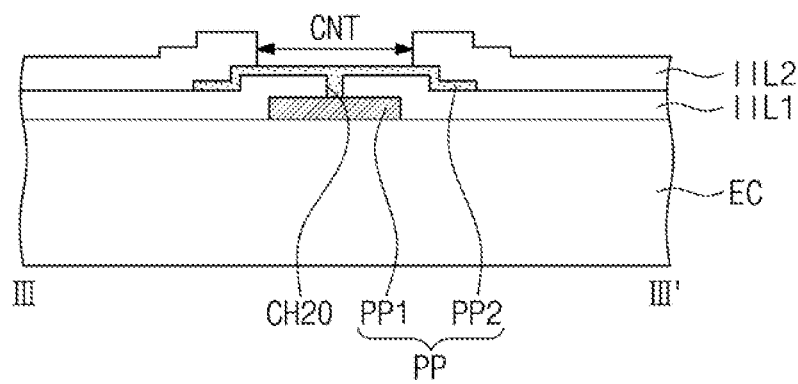
FIG. 8L is a cross-sectional view taken along a line III-III' shown in FIG. 8K illustrating the input sensor.

FIG. 8A is a plan view schematically illustrating the input sensor ISP shown in FIG. 5. FIG. 8B is an enlarged plan view illustrating four unit sensing areas UA shown in FIG. 8A. FIG. 8C is an enlarged plan view illustrating one unit sensing area UA shown in FIG. 8B. FIG. 8D is an enlarged plan view illustrating a cell area SA shown in FIG. 8C. FIG. 8E is an enlarged plan view illustrating a first group area CA1 shown in FIG. 8C. FIG. 8F is a cross-sectional view taken along a line II-II' of FIG. 8E illustrating the input sensor ISP. FIG. 8G is an enlarged plan view illustrating a second group area CA2 shown in FIG. 8C. FIG. 8H is an enlarged plan view illustrating a third group area CA3 shown in FIG. 8C. FIG. 8I is an enlarged plan view illustrating a fourth group area CA4 shown in FIG. 8C. FIG. 8J is an enlarged plan view illustrating a portion BB of FIG. 8C. FIG. 8K is an enlarged plan view illustrating a pad area PA shown in FIG. 5. FIG. 8L is a cross-sectional view taken along a line III-III' shown in FIG. 8K illustrating the input sensor ISP.

Referring to FIG. 8A, the sensing area ISA includes a plurality of unit sensing areas UA arranged in a matrix form. As shown in FIG. 8A, the entire sensing area ISA of the input sensor ISP is provided with only the unit sensing areas UA, however, the present invention is not necessarily limited thereto or thereby. In an embodiment of the present disclosure, the input sensor ISP may include a first sensing area and a second sensing area, which are distinguished from each other. The first sensing area may include only the unit sensing areas UA, and the second sensing area disposed outside of the first sensing area may include areas other than the unit sensing area UA or may include unit sensing area that are different from the unit sensing area UA described below. For example, at least a portion of the sensing area ISA may be uniformly divided into the unit sensing areas UA. The unit sensing areas UA may be arranged in rows and columns, e.g., a matrix form.

The unit sensing areas UA may include at least the electrode-crossing area ECA shown in FIG. 5. Depending on a crossing ratio of the first electrodes SE1_1 to SE1_n and the second electrodes SE2_1 to SE2_m, the unit sensing areas UA may include only the electrode-crossing area ECA or may further include the non-crossing area N-CA of the first electrodes SE1_1 to SE1_n and the second electrodes SE2_1 to SE2_m.

Referring to FIG. 8B, two first electrodes SE1 and two second electrodes SE2, which are disposed in four unit sensing areas UA, are shown. The input sensor ISP, according to an embodiment, may include dummy electrodes DE reducing a difference in visibility between areas in which the first electrodes SE1 and the second electrodes SE2 are not disposed and areas in which the first electrodes SE1 and the second electrodes SE2 are disposed, however, the present invention is not necessarily limited thereto or thereby. In an embodiment of the present disclosure, the dummy electrodes DE may be omitted.

A width W1 of the first electrodes SE1 in the electrode-crossing area ECA is substantially the same as a width W1 of the first electrodes SE1 in the non-crossing area N-CA, and a width W2 of the second electrodes SE2 in the electrode-crossing area ECA is substantially the same as a width W2 of the second electrodes SE2 in the non-crossing area N-CA. Each of the first electrode SE1 and the second electrode SE2 may include an area having a relatively large width and an area having relatively small width, however, widths of each of the first and second electrodes SE1 and SE2, which are measured from the same point of the electrode-crossing area ECA and the non-crossing area N-CA, are substantially constant. Since the widths of each of the first and second electrodes SE1 and SE2 are constant in the electrode-crossing area ECA and the non-crossing area N-CA, the shape of the first electrodes SE1 and the shape of the second electrodes SE2 may be defined as the bar shape or the stripe shape. The width W1 of the first electrode SE1 is smaller than a width in the second direction DR2 of the unit sensing area UA, and the width W2 of the second electrode SE2 is smaller than a width in the first direction DR1 of the unit sensing area UA.

Referring to FIG. 8C, the input sensor ISP has a mesh shape. The input sensor ISP includes a plurality of first-line elements LE1 substantially extending in a first direction EDR1 and a plurality of second-line elements LE2 extending in a second direction EDR2 crossing the first direction EDR1.

The first-line elements LE1 and the second-line elements LE2 define a plurality of crossing areas CA. The crossing areas CA are areas where the first-line elements LE1 and second-line elements LE2 form an imaginary crossing point or a real crossing point. A difference between the imaginary crossing point and the real crossing point is described below. An open area OP is an area corresponding to the smallest polygonal shape defined by the first-line elements LE1 and the second-line elements LE2 in a plane, and the first-line element LE1 and the second-line element LE2 are not disposed in the polygonal-shaped area. The polygonal shape corresponding to the open area OP may be a diamond shape (e.g., a rhomboid shape).

Since an area where the first electrode SE1 and the second electrode SE2 having the mesh shape overlap the second electrode CE of the display device DD is small, a base capacitance Cb (refer to FIG. 4) is small. Accordingly, a signal transmission of the driving signals TS1 and TS2 (refer to FIG. 6) or the uplink signals TSa, TSb, TSc, and TSd (refer to FIG. 7A) is fast. This is because an RC delay of the signal is small. In this case, the first-line elements LE1 and the second-line elements LE2 may include a metal material to lower a resistance of the first electrode SE1 and the second electrode SE2.

Among the first-line elements LE1 and the second-line elements LE2, first group elements LE-G1 are electrically connected to each other to define the first electrode SE1, and among the first-line elements LE1 and the second-line elements LE2, second group elements LE-G2 are electrically connected to each other to define the second electrode SE2.

The first-line elements LE1 of the first group elements LE-G1 define first electrode lines E1-L1 of the first electrode SE1. The second-line elements LE2 of the first group elements LE-G1 define second electrode lines E1-L2 of the first electrode SE1. The first-line elements LE1 of the second group elements LE-G2 define first electrode lines E2-L1 of the second electrode SE2. The second-line elements LE2 of the second group elements LE-G2 define second electrode lines E2-L2 of the second electrode SE2.

The first electrode line E1-L1 of the first electrode SE1 may be substantially parallel to the first electrode line E2-L1 of the second electrode SE2, and the second electrode line E1-L2 of the first electrode SE1 may be substantially parallel to the second electrode line E2-L2 of the second electrode SE2. The first electrode line E2-L1 of the second electrode SE2 may be disposed between two first electrode lines E1-L1 of the first electrode SE1, which are most adjacent to each other in the second direction EDR2. The first electrode line E2-L1 of the second electrode SE2 may be disposed closer to one of the first electrode lines E1-L1 of the first electrode SE1 than the other. One open area OP may be disposed between the first electrode line E2-L1 of the second electrode SE2 and the first electrode line E1-L1 of the first electrode SE1, which are relatively close to each other, and two open areas OP may be disposed between the first electrode line E2-L1 of the second electrode SE2 and the first electrode line E1-L1 of the first electrode SE1, which are further away. To aid understanding, three open areas OP are indicated by hatching in FIG. 8C.

Among the first-line elements LE1 and the second-line elements LE2, third group elements LE-G3 may define the dummy electrode DE insulated from the first electrode SE1 and the second electrode SE2. After forming the first-line elements LE1 and the second-line elements LE2 connected entirely, the first-line elements LE and the second-line elements LE2 are disconnected according to a predetermined rule such that three group elements LE-G1, LE-G2, and LE-G3 are distinguished from each other to insulate the first electrode SE1, the second electrode SE2, and the dummy electrode DE from each other. The area that is disconnected as described above corresponds to the imaginary crossing point described below.

In FIG. 8C, the three group elements LE-G1, LE-G2, and LE-G3 are illustrated differently to be distinguished from each other, however, the first group elements LE-G1, the second group elements LE-G2, and the third group elements LE-G3 may have substantially the same line width, thickness, and material as each other. The first group elements LE-G1, the second group elements LE-G2, and the third group elements LE-G3 may be distinguished from each other by electrical connections.

As shown in FIG. 8C, the unit sensing area UA includes a plurality of cell areas SA. For example, the unit sensing area UA may be uniformly divided into the cell areas SA. The cell areas SA may be arranged in rows by columns. FIG. 8C shows six cell areas SA as a representative example. Each of the cell areas SA includes one crossing area CA.

The cell area SA are described in detail with reference to FIG. 8D. Referring to FIG. 8D, one crossing area CA-C (hereinafter, referred to as a center crossing area) is disposed at a center of the cell area SA. The cell area SA is defined by four crossing areas CA-C1 to CA-C4 that are closest to the center crossing area CA-C.

FIG. 8D shows emission areas PXA-R, PXA-B, PXA-G1, and PXA-G2 of the display panel DP (refer to FIG. 4). In FIG. 8D, four types of emission areas PXA-R, PXA-B, PXA-G1, and PXA-G2 having different shapes from each other are shown as a representative example, however, the present invention is not necessarily limited thereto or thereby. In an embodiment, two types of emission areas among the four types of emission areas PXA-R, PXA-B, PXA-G1, and PXA-G2 emit light having the same color, however, the present invention is not necessarily limited thereto or thereby.

A first emission area PXA-R is an emission area of a first color pixel, a second emission area PXA-B is an emission area of a second color pixel, and third and fourth emission areas PXA-G1 and PXA-G2 are emission areas of a third color pixel. A first color light is a red light, a second color light is a blue light, a third color light is a green light, and the first color light, the second color light, and the third color light may be changed to three other primary colors. According to an embodiment of the present disclosure, the third and fourth emission areas PXA-G1 and PXA-G2 may have the same shape as each other.

The display panel DP may include a plurality of unit pixel areas PUA. Each of the unit pixel areas PUA may include a plurality of emission areas, and the unit pixel areas PUA may include the same number of emission areas. The unit pixel areas PUA may have the same arrangement of emission areas. The unit pixel areas PUA may be grouped into two groups. The unit pixel areas included in the same group have the same arrangement of emission areas, and the unit pixel areas included in different groups may have different arrangements of emission areas. Although the arrangements of the emission areas of the two groups of the unit pixel areas PUA are different from each other, the emission areas corresponding to each other are provided to the two groups of the unit pixel areas PUA, respectively.

The unit pixel areas PUA may have the same size when viewed in a plane. The unit pixel areas PUA are defined by dividing the display panel DP into the same areas each of which includes the same number of emission areas.

The unit pixel areas PUA may have a quadrilateral shape including a first diagonal line CL1 and a second diagonal line CL2 crossing the first diagonal line CL1. The unit pixel areas PUA may have a square shape or a rectangular shape.

Each of the unit pixel areas PUA includes the first emission area PXA-R, the second emission area PXA-B, the third emission area PXA-G1, and the fourth emission area PXA-G2. The first emission area PXA-R and the second emission area PXA-B face each other in the first direction DR1, and the third emission area PXA-G1 and the fourth emission area PXA-G2 face each other in the second direction DR2. The first diagonal line CL1 passing through the first emission area PXA-R and the second emission area PXA-B is substantially parallel to the first direction DR1, and the second diagonal line CL2 passing through the third emission area PXA-G1 and the fourth emission area PXA-G2 is substantially parallel to the second direction DR2. Accordingly, an angle between the first diagonal line CL1 and the second diagonal line CL2 may be about 90 degrees. The angle is referred to as a first angle $\theta 1$.

In an embodiment, the first angle $\theta 1$ may be about 90 degrees. In an embodiment, all angles between the first diagonal line CL1 and the second diagonal line CL2 may be about 90 degrees. According to an embodiment of the present disclosure, the angle defined by the first diagonal line CL1 and the second diagonal line CL2 may include an acute angle and an obtuse angle. The present disclosure is described with respect to the unit pixel area PUA including four types of emission areas PXA-R, PXA-B, PXA-G1, and PXA-G2, however, the present invention is not necessarily limited thereto or thereby. The arrangement of the diagonal line and the first angle $\theta 1$ may be changed depending on the arrangement and number of the emission areas of the unit pixel area PUA.

The first-line element LE1 and the second-line element LE2 having the straight line shape and disposed in the cell area SA may overlap some of the first emission area PXA-R, the second emission area PXA-B, the third emission area PXA-G1, and the fourth emission area PXA-G2. According to an embodiment of the present disclosure, the first-line element LE1 and the second-line element LE2, which are disposed in the cell area SA, may be disposed only in the non-emission area NPXA while maintaining their directions of extension EDR1 and EDR2, and in this case, the first-line element LE1 and the second-line element LE2 may include a plurality of bending areas.

The first-line element LE1 and the second-line element LE2 disposed in the cell area SA define an angle in the crossing area CA. The angle is described as a second angle θ2. The second angle θ2 is selected to correspond to the first angle θ1. For instance, when two diagonal lines define the acute angle and the obtuse angle and the first-line element LE1 and the second-line element LE2 define the acute angle and the obtuse angle, both the first angle θ1 and the second angle θ2 may be the acute angle or the obtuse angle.

The first angle 91 and the second angle θ2 corresponding to the first angle θ1 have different values. The first angle θ1 is an index indicating a period in which the unit pixel areas PUA are repeatedly placed, and the second angle θ2 is an index indicating a period in which the cell areas SA are repeatedly placed. When the first angle θ1 and the second angle θ2 are the same as each other, the period of the unit pixel areas PUA overlaps the period of the cell areas SA, and this causes a moiré phenomenon. According to an embodiment, as the first angle θ1 is different from the second angle θ2, the overlap between the period of the unit pixel areas PUA and the period of the cell areas SA may be reduced, and thus, the moiré phenomenon may be prevented.

Referring to FIG. 8C again, the cell areas SA may be arranged in N-by-M matrix in one unit sensing area UA. In an embodiment, each of "N" and "M" may be a multiple of 3, and "N" and "M" may be different natural numbers from each other. "N" may be greater than "M", "N" may be 18, and "M" may be 12. As values of "N" and "M" increase, the size of the cell areas SA decreases, and the number of the cell areas SA increases.

A vertical width W10 of the cell area SA (i.e., a width in the second direction DR2) may be smaller than a horizontal width W20 of the cell area SA (i.e., a width in the first direction DR1). A ratio of the vertical width to the horizontal width of the cell area SA may be set to minimize the moiré phenomenon. The ratio of the vertical width to the horizontal width of the cell area SA may be determined by the unit pixel areas PUA applied to products, and it should not be limited to particular values.

The crossing area CA is described in detail with reference to FIGS. 8C and 8E to 8I. The crossing area CA may include first, second, third, and fourth crossing areas CA1, CA2, CA3, and CA4.

Referring to FIGS. 8C and 8E, one element of the first-line element LE1 and the second-line element LE2 of the first group elements LE-G1 may cross the other element of the first-line element LE1 and the second-line element LE2 of the second group elements LE-G2. FIG. 8E shows the first crossing area CA1 in which the second-line element LE2 of the first group elements LE-G1 and the first-line element LE1 of the second group elements LE-G2 define the imaginary crossing point. The first crossing area CA1 in which the second-line element LE2 of the first group elements LE-G1 is disconnected and the first-line element LE1 of the second group elements LE-G2 passes through the disconnected portion of the second-line element LE2 is shown in FIG. 8E, however, the present invention is not necessarily limited thereto or thereby. According to an embodiment of the present disclosure, the first-line element LE1 of the second group elements LE-G2 may be disconnected in the first crossing area CA1.

Referring to FIG. 8F, the first-line element LE1 and the second-line element LE2 may be disposed directly on the upper surface of the encapsulation substrate ES without an adhesive layer after being formed through successive processes. The first sensor insulating layer IIL1 at least partially covers the first-line element LE1 and the second-line element LE2. A bridge pattern BRP is disposed on the first sensor insulating layer IIL1 and connects the disconnected portion of the second-line element LE2 of the first group elements LE-G1 through contact holes CH20. According to an embodiment of the present disclosure, the bridge pattern BRP may be disposed on the upper surface of the encapsulation substrate EC, and the first-line element LE1 and the second-line element LE2 may be disposed on the first sensor insulating layer IIL1.

Referring to FIGS. 8C and 8G, one element of the first-line element LE1 and the second-line element LE2 of the first group elements LE-G1 may cross the other element of the first-line element LE1 and the second-line element LE2 of the second group elements LE-G2. FIG. 8G illustrates the second crossing area CA2 in which the second-line element LE2 of the first group elements LE-G1 and the first-line element LE1 of the second group elements LE-G2 define the imaginary crossing point. The first-line element LE1 of the second group elements LE-G2 is disconnected. Different from the first crossing area CA1, the bridge pattern BRP is not disposed in the second crossing area CA2.

A resistance and/or an intensity of a current flowing through the first sensing electrode SE1 and/or the second sensing electrode SE2 may be controlled by adjusting the number of the bridge patterns BRP. For example, as shown in FIG. 9B, the second crossing area CA2 may be disposed in an area that has a low influence on the flow of current. Referring to FIG. 9B, since the current of the first electrode SE1 flows in the first direction DR1 and the second crossing area CA2 induces the flow of the current to the second direction DR2, it has a low influence on the flow of the current. Accordingly, the bridge pattern BRP that connects the first-line element LE1 or the second-line element LE2 of the first electrode SE1 may be omitted.

Referring to FIG. 8H, one element of the first-line element LE1 of the first group elements LE-G1, the second-line element LE2 of the first group elements LE-G1, the first-line element LE1 of the second group elements LE-G2, and the second-line element LE2 of the second group elements LE-G2 may cross the other element of the first-line element LE1 of the third group elements LE-G3 and the second-line element LE2 of the third group elements LE-G3. FIG. 8H show the third crossing area CA3 in which the second-line element LE2 of the first group elements LE-G1 and the first-line element LE1 of the third group elements LE-G3 define the imaginary crossing point. Similar to the second crossing area CA2, the bridge pattern BRP might also not be disposed in the third crossing area CA3. The second-line element LE2 of the first group elements LE-G1, which is disconnected, is shown as an example, however, the present invention is not necessarily limited thereto or thereby. The first-line element LE1 of the third group elements LE-G3 may be disconnected.

The third crossing area CA3 defines a boundary of the first electrode SE1, the second electrode SE2, and the dummy electrode DE. As one of the first-line element LE1 or the second-line element LE2 of the first electrode SE1, the second electrode SE2, and the dummy electrode DE is spaced apart from the other of the first-line element LE1 or the second-line element LE2 of the first electrode SE1, the second electrode SE2, and the dummy electrode DE, the first electrode SE1, the second electrode SE2, and the dummy electrode DE are electrically insulated from each other.

Referring to FIG. 8I, the first-line element LE1 and the second-line element LE2 of the first group elements LE-G1 may be provided integrally with each other (e.g., provided as one contiguous structure) and may cross each other, the first-line element LE1 and the second-line element LE2 of the second group elements LE-G2 may be provided integrally with each other and may cross each other, and the first-line element LE1 and the second-line element LE2 of the third group elements LE-G3 may be provided integrally with each other and may cross each other. FIG. 8I shows the fourth crossing area CA4 in which the first-line element LE1 and the second-line element LE2 of the first group elements LE-G1 define the real crossing point. The bridge pattern BRP is not needed for the fourth crossing area CA4 and so may be omitted therefrom.

Referring to FIG. 8J, the open area defined by the first-line element LE1 and the second-line element LE2 to be adjacent to the first crossing area CA1 may have an opened diamond shape. The open area defined by the first-line element LE1 and the second-line element LE2 to be adjacent to the second crossing area CA2 may have an opened diamond shape. The open area defined by the first-line element LE1 and the second-line element LE2 to be adjacent to the third crossing area CA3 may have an opened diamond shape. The opened diamond shape connects the open areas adjacent to each other. The open area defined by the first-line element LE1 and the second-line element LE2 to be adjacent to the fourth crossing area CA4 may have an opened diamond shape. The open area defined by the first-line element LE1 and the second-line element LE2 to be adjacent to the fourth crossing area CA4 disposed in the dummy electrode DE may have a closed diamond shape.

As shown in FIGS. 5 and 8K, the first and second signal lines SL1 and SL2 may include the line portion LP and the pad portion PP. The pad portion PP may include a first layer PP1 and a second layer PP2. The line portion LP may be provided integrally with the first layer PP1 of the pad portion PP. The line portion LP may be formed through the same process as, may include the same material as, and may have the same stack structure as the first layer PP1 of the pad portion PP. According to an embodiment, the line portion LP and the pad portion PP may have different line widths from each other, however, the line portion LP and the pad portion PP may have the same line width.

As shown in FIG. 8K, the first layer PP1 of the pad portion PP is disposed between the upper surface of the encapsulation substrate ES and the first sensor insulating layer IIL1. The second layer PP2 of the pad portion PP is disposed on the first sensor insulating layer IIL1 and connected to the first layer PP1 of the pad portion PP via contact holes CH20 defined through the first sensor insulating layer IIL1. The second sensor insulating layer IIL2 is provided with a contact hole CNT through which at least the second layer PP2 of the pad portion PP is exposed. At least the second layer PP2 of the pad portion PP may be electrically connected to a pad of a flexible circuit board via an anisotropic conductive film or a solder ball. The second layer PP2 of the pad portion PP may be formed through the same process as, may include the same material as, and may have the same stack structure as the bridge pattern BRP (refer to FIG. 8F). The second layer PP2 of the pad portion PP and the bridge pattern BRP may include a transparent conductive oxide.

Figure 9A:
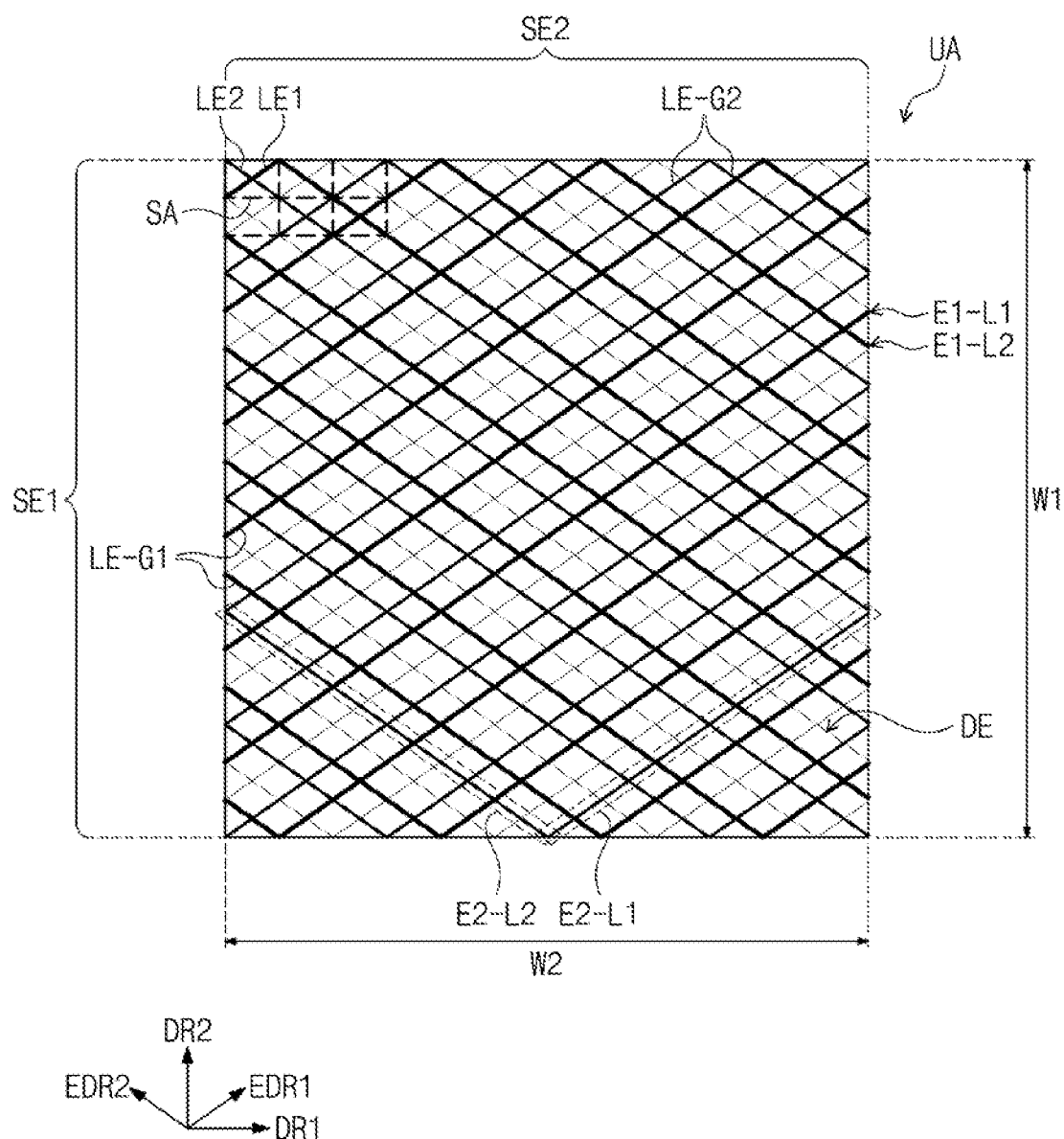
FIGS. 9A and 9B are enlarged plan views illustrating a unit sensing area according to an embodiment of the present disclosure.
Figure 9B:
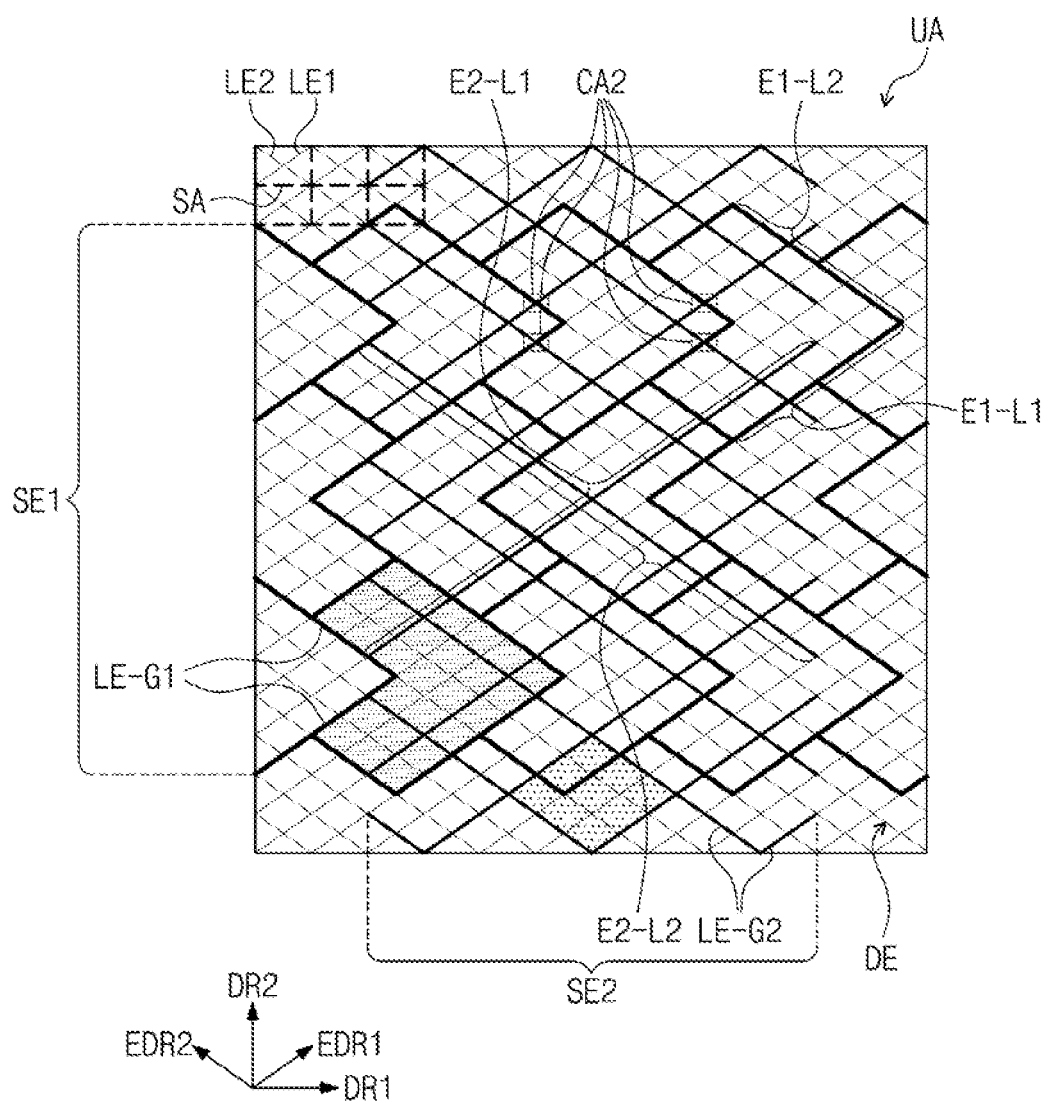

FIGS. 9A and 9B are enlarged plan views illustrating a unit sensing area UA according to an embodiment of the present disclosure. Hereinafter, to the extent that a detailed description of elements described with reference to FIGS. 8A to 8L is omitted, it may be assumed that these elements are at least similar to corresponding elements that are described elsewhere in the instant disclosure.

Referring to FIG. 9A, a width in the first direction DR1 of the unit sensing area UA is substantially the same as the width W2 in the first direction DR1 of the second electrode SE2. A width in the second direction DR2 of the unit sensing area UA is substantially the same as the width W1 in the second direction DR2 of the first electrode SE1. The unit sensing area UA is defined to be substantially the same as the crossing area CA described with reference to FIG. 8B.

Different from FIG. 8B in which the non-crossing area N-CA is disposed to have a predetermined size, a boundary between the first electrodes SE1 adjacent to each other and a boundary between the second electrodes SE2 adjacent to each other are defined by the disconnection of the first-line elements LE1 and the second-line elements LE2.

In this case, in the unit sensing area UA, a length of the longest electrode line among the first electrode lines E1-L1 of the first electrode SE1 is substantially the same as a length of the longest electrode line among the first electrode lines E2-L1 of the second electrode SE2. A length of the longest electrode line among the second electrode lines E1-L2 of the first electrode SE1 is substantially the same as a length of the longest electrode line among the second electrode lines E2-L2 of the second electrode SE2.

Referring to FIG. 9I, when compared with the unit sensing area UA shown in FIG. 8A, a size of the first-line elements LE1 and the second-line elements LE2 of the first electrodes SE1 decreases, and a size of the first-line elements LE1 and the second-line elements LE2 of the dummy electrode DE increases. Accordingly, in the unit sensing area UA, the longest electrode line among the first electrode lines E1-L1 of the first electrode SE1 is shorter than the longest electrode line among the first electrode lines E2-L1 of the second electrode SE2. The longest electrode line among the second electrode lines E1-L2 of the first electrode SE1 is shorter than the longest electrode line among the second electrode lines E2-L2 of the second electrode SE2.

When compared with the unit sensing area UA shown in FIG. 8A, the width W2 of the second electrode SE2 decreases. The size of the first-line elements LE1 and the second-line elements LE2 of the second electrodes SE2 decreases, and the size of the first-line elements LE1 and the second-line elements LE2 of the dummy electrode DE increases. The decrease in size of the second electrodes SE2 is smaller than the decrease in size of the first electrodes SE1.

The polygonal shape defined by the first electrode lines E1-L1 of the first electrode SE1 and the second electrode lines E1-L2 of the first electrode SE1 may have an area greater than that of the polygonal shape defined by the first electrode lines E2-L1 of the second electrode SE2 and the second electrode lines E2-L2 of the second electrode SE2. FIG. 9B shows a hexagonal shape defined in the first electrode SE1 and a quadrilateral shape defined in the second electrode SE2. In FIG. 9B, one hexagonal shape among a plurality of hexagonal shapes is shown by hatching, and one quadrilateral shape among a plurality of quadrilateral shapes is shown by hatching.

Figure 10A:
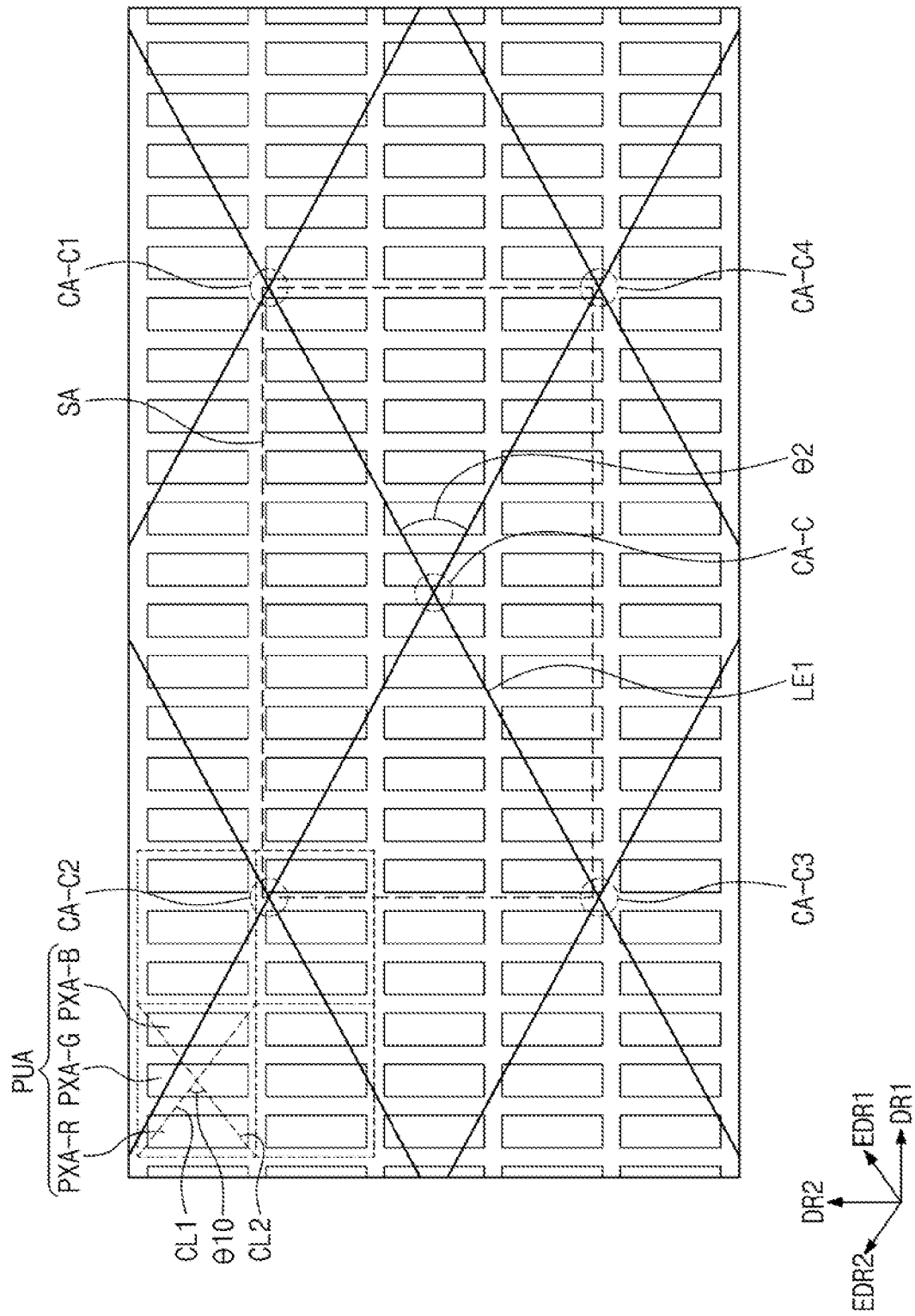
FIGS. 10A and 10B are enlarged plan views illustrating a cell area according to an embodiment of the present disclosure.
Figure 10B:
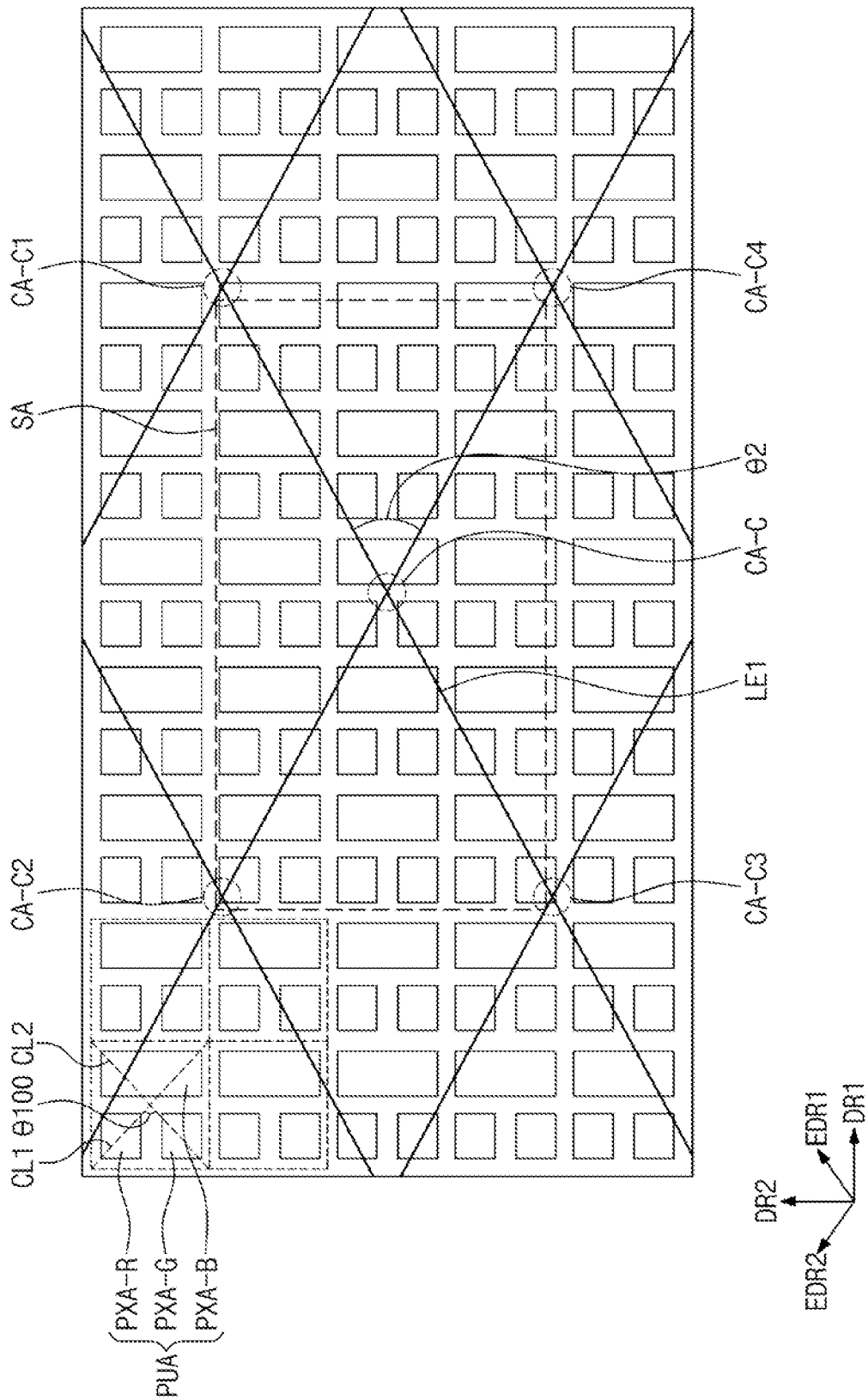

FIGS. 10A and 10B are enlarged plan views illustrating cell areas SA according to an embodiment of the present disclosure. Hereinafter, to the extent that a detailed description of elements described with reference to FIGS. 8C and 8D is omitted, it may be assumed that these elements are at least similar to corresponding elements that are described elsewhere in the instant disclosure.

Referring to FIG. 10A, each of unit pixel areas PUA includes a first emission area PXA-R, a second emission area PXA-B, and a third emission area PXA-G. The third emission area PXA-G is disposed between the first emission area PXA-R and the second emission area PXA-B in each of the unit pixel areas PUA, however, an arrangement of emission areas may be changed. Each of the first emission area PXA-R, the second emission area PXA-B, and the third emission area PXA-G may extend in the second direction DR2. The first emission area PXA-R, the second emission area PXA-B, and the third emission area PXA-G may have substantially the same size as each other.

The unit pixel area PUA may have a first angle θ10 defined by a first diagonal line CL1 and a second diagonal line CL2. The first angle 910 may be an acute angle and may have a different value from that of a second angle 92.

Referring to FIG. 11B, each of unit pixel areas PUA includes a first emission area PXA-R, a second emission area PXA-B, and a third emission area PXA-G. The second emission area PXA-B has the largest size. The first emission area PXA-R and the third emission area PXA-G are disposed at a left side of the second emission area PXA-B. The first emission area PXA-R and the third emission area PXA-G may have substantially the same size as each other.

The unit pixel area PUA may have a first angle θ100 defined by a first diagonal line CL1 and a second diagonal line CL2. The first angle θ100 may have a different value from that of a second angle θ2.

Although embodiments of the present disclosure have been described, it is understood that the present invention is not necessarily limited to these embodiments but various changes and modifications can be made by one ordinary skilled in the art within the spirit and scope of the present disclosure.

What is claimed is:

1. A display device, comprising:
a display panel; and
an input sensor disposed on the display panel and comprising a first electrode, a second electrode insulated from the first electrode and crossing the first electrode, and a dummy electrode insulated from the first electrode and the second electrode,
wherein the first electrode includes first-line elements extended in a first direction and second-line elements extended in a second direction crossing the first direction, the first-line elements and the second-line elements are electrically connected to each other,
wherein the second electrode includes third-line elements extended in the first direction and fourth-line elements extended in the second direction, and the third-line elements and the fourth-line elements are electrically connected to each other,
wherein the dummy electrode includes fifth-line elements extended in the first direction and sixth-line elements extended in the second direction and the fifth-line elements and the sixth-line elements are electrically connected to each other,
wherein the first-line elements and the fourth-line elements define first crossing areas in each of which one element of the first-line elements and the fourth-line elements has an area of disconnection and another element of the first-line elements and the fourth-line elements passes through the area of disconnection, and
wherein the first-line elements and the second-line elements define second crossing areas in each of which one element of the first-line elements is provided integrally with one element of the second-line elements.

2. The display device of claim 1, wherein the input sensor further comprises a bridge pattern,
wherein the bridge pattern is disposed in at least one area of the first crossing areas,
wherein the bridge pattern is disposed on a layer that is different from a layer on which the first-line elements and the fourth-line elements are disposed, and
wherein the bridge pattern connects the area of disconnection of the disconnected one element disposed in the at least one area.

3. The display device of claim 2, wherein the bridge pattern comprises a transparent conductive oxide.

4. The display device of claim 1, wherein the display panel comprises a plurality of unit pixel areas each having a quadrilateral shape.

5. The display device of claim 4, wherein each of the unit pixel areas comprises a plurality of emission areas, and the unit pixel areas comprise a same number of the emission areas as each other.

6. The display device of claim 5, wherein one of the first-line elements overlaps a corresponding emission area of the plurality of emission areas.

7. The display device of claim 1, wherein a portion of the dummy electrode is disposed in the first electrode and the second electrode.

8. The display device of claim 7, wherein the first-line elements the second-line elements define an opening and the portion of the dummy electrode is disposed in the opening.

9. The display device of claim 1, wherein the first-line elements and the sixth-line elements define third crossing areas in each of which one element of the first-line elements and the sixth-line elements has an area of disconnection and another element of the first-line elements and the sixth-line elements passes through the area of disconnection.

10. The display device of claim 1, wherein the fifth-line elements and the sixth-line elements define fourth crossing areas in each of which one element of the fifth-line elements is provided integrally with one element of the sixth-line elements.

11. The display device of claim 1, wherein at least one of the fifth-line elements and sixth-line elements is disposed between one of the first-line elements and one of the third-line elements.

12. The display device of claim 1, wherein at least one of the fifth-line elements and sixth-line elements is disposed between one of the first-line elements and another one of the first-line elements.

13. The display device of claim 1, wherein a width of the first electrode in a first area in which the first electrode crosses the second electrode is substantially the same as a width of the first electrode in a second area in which the first electrode does not cross the second electrode, and
wherein a width of the second electrode in the first area is substantially the same as a width of the second electrode in the second area.

14. The display device of claim 1, wherein the display panel comprises:
a base layer;
a transistor disposed on the base layer;
a light emitting element electrically connected to the transistor; and
an encapsulation substrate facing the base layer and covering the light emitting element,
wherein the first electrode, the second electrode, and the dummy electrode are disposed on an upper surface of the encapsulation substrate, and an adhesive layer is omitted between the upper surface of the encapsulation substrate and the first electrode, between the upper surface of the encapsulation substrate and the second electrode, and between the upper surface of the encapsulation substrate and the dummy electrode.

15. The display device of claim 1, wherein the first-line elements and the second-line elements each comprise a metal.

16. The display device of claim 1, further comprising an input device applying an input signal to the input sensor,
wherein the input sensor senses a user input based on a variation in capacitance between the first electrode and the second electrode in a first mode and senses an input by the input device based on the input signal in a second mode.

17. The display device of claim 1, wherein the first electrode, the second electrode and the dummy electrode are disposed in a sensing area,
wherein the sensing area comprises a plurality of cell areas arranged in a matrix form,
wherein a first group of the plurality of cell areas includes a corresponding one of the first crossing areas, and
wherein a second group of the plurality of cell areas includes a corresponding one of the second crossing areas.

18. The display device of claim 1, wherein the first electrode, the second electrode and the dummy electrode are disposed in a sensing area,
wherein the sensing area comprises a plurality of cell areas arranged in a matrix form, and
wherein each of the plurality of cell areas includes a crossing area defined by one line element among the first-line elements, the third-line elements, and fifth-line elements and one line element among the second-line elements, the fourth-line elements, and sixth-line elements.

19. The display device of claim 1, wherein a crossing area defining a boundary of the first electrode, the second electrode and the dummy electrode allows one line element among the first-line elements, the third-line elements, and fifth-line elements to be disconnected at an area of disconnection and one line element among the second-line elements, the fourth-line elements, and sixth-line elements to pass through the area of disconnection, or
one line element among the second-line elements, the fourth-line elements, and sixth-line elements to be disconnected at an area of disconnection and one line element among the first-line elements, the third-line elements, and fifth-line elements to pass through the area of disconnection.

* * * * *